US011796392B2

(12) United States Patent
Schilt et al.

(10) Patent No.: US 11,796,392 B2
(45) Date of Patent: Oct. 24, 2023

(54) DUAL-COMB SPECTROSCOPY

(71) Applicant: IRsweep AG, Stäfa (CH)

(72) Inventors: Stéphane Schilt, Neuchâtel (CH); Pierre Brochard, Neuchâtel (CH); Kenichi Komagata, Neuchâtel (CH); Giulio Terrasanta, Stäfa (CH); Andreas Hugi, Stäfa (CH)

(73) Assignee: IRsweep AG, Stäfa (CH)

( * ) Notice: Subject to any disclaimer, the term of this patent is extended or adjusted under 35 U.S.C. 154(b) by 0 days.

(21) Appl. No.: 18/063,213

(22) Filed: Dec. 8, 2022

(65) Prior Publication Data
US 2023/0107251 A1 Apr. 6, 2023

Related U.S. Application Data

(63) Continuation of application No. 17/518,874, filed on Nov. 4, 2021, now Pat. No. 11,629,997.

(30) Foreign Application Priority Data

Nov. 6, 2020 (GB) ...................... 2017556

(51) Int. Cl.
*G01J 3/433* (2006.01)
*G01J 3/10* (2006.01)
(Continued)

(52) U.S. Cl.
CPC .................. *G01J 3/433* (2013.01); *G01J 3/10* (2013.01); *H01S 5/0623* (2013.01);
(Continued)

(58) Field of Classification Search
CPC ............ G01J 3/433; G01J 3/42; H01S 5/0623
See application file for complete search history.

(56) References Cited

U.S. PATENT DOCUMENTS 7,291,839 B1 11/2007 Demers et al.
2009/0245306 A1 10/2009 Rakuljic
(Continued)

FOREIGN PATENT DOCUMENTS

EP 3609028 A1 2/2020
EP 3786597 A1 3/2021
(Continued)

OTHER PUBLICATIONS

Atif Shehzad, "Frequency noise correlation between the offset frequency and the mode spacing in a mid-infrared quantum cascade laser frequency comb", Mar. 16, 2020, Optics Express (Year: 2020).*

(Continued)

*Primary Examiner* — Maurice C Smith
(74) *Attorney, Agent, or Firm* — Renner, Otto, Boisselle & Sklar, LLP

(57) ABSTRACT

A dual-comb spectrometer comprising two lasers outputting respective frequency combs having a frequency offset between their intermode beat frequencies. One laser acts as a master and the other as a follower. Although the master laser is driven nominally with a DC drive signal, the current on its drive input line nevertheless oscillates with an AC component that follows the beating of the intermode comb lines lasing in the driven master laser. This effect is exploited by tapping off this AC component and mixing it with a reference frequency to provide the required frequency offset, the mixed signal then being supplied to the follower laser as the AC component of its drive signal. The respective frequency combs in the optical domain are thus phase-locked relative to each other in one degree of freedom, so that the electrical signals obtained by multi-heterodyning the two optical signals are frequency stabilized.

11 Claims, 14 Drawing Sheets

(51) Int. Cl.
  *H01S 5/40*    (2006.01)
  *H01S 5/062*   (2006.01)
  *G01J 3/42*    (2006.01)

(52) U.S. Cl.
  CPC ....... *H01S 5/4006* (2013.01); *G01J 2003/102* (2013.01); *G01J 2003/423* (2013.01); *G01J 2003/4332* (2013.01)

(56) References Cited

U.S. PATENT DOCUMENTS

| | | |
|---|---|---|
| 2011/0069309 A1 | 3/2011 | Newbury et al. |
| 2016/0377482 A1 | 12/2016 | Moffitt et al. |
| 2017/0256909 A1 | 9/2017 | Braddell et al. |
| 2019/0028203 A1 | 1/2019 | Kuse et al. |

FOREIGN PATENT DOCUMENTS

| | | |
|---|---|---|
| JP | 2020106477 A | 7/2020 |
| WO | 2020030772 A1 | 2/2020 |

OTHER PUBLICATIONS

Cappelli et al, "Frequency stability characterization of a quantum cascade laser frequency comb" Laser Photonics Rev. 10, No. 4, 623-630 (2016).

Cappelli et al, "Retrieval of phase relation and emission profile of quantum cascade laser frequency combs," Nat. Photonics 13(8), 562-568 (2019).

Consolino, Nafa, Cappelli et al., "Fully phase-stabilized quantum cascade laser frequency comb" Nat Commun 10, 2938 (2019).

Di Domenico et al, "Simple approach to the relation between laser frequency noise and laser line shape," Applied optics 49(25), 4801-4807 (2010).

Ghiri and Kamran, "A Miniaturized 3-10GHZ Dual-Comb Spectroscopy System for Chemical Detection." 2019 IEEE MTT-S International Microwave Symposium (IMS) (2019): 1492-1494.

Rompelman and Ros, "Coherent averaging technique: A tutorial review Part 1: Noise reduction and the equivalent filter," Journal of Biomedical Engineering 8(1), 24-29 (1986).

Rompelman and Ros, "Coherent averaging technique: A tutorial review Part 2: Trigger jitter, overlapping responses and non-periodic stimulation," Journal of Biomedical Engineering 8(1), 30-35 (1986).

Rösch, Scalari, Villares, Bosco, Beck and Faist "On-chip, self-detected terahertz dual-comb source" Appl. Phys. Lett. 108, 171104 (2016).

Westberg, Jonas & Sterczewski, Lukasz & Wysocki, Gerard. (2017). Mid-infrared multiheterodyne spectroscopy with phase-locked quantum cascade lasers. Applied Physics Letters. 110. 10.1063/1.4979825.

Simon Ayotte, André Babin, François Costin, "Ultra-low noise optical phase-locked loop," Proc. SPIE 8961, Fiber Lasers XI: Technology, Systems, and Applications, 89612J (Mar. 7, 2014); https://doi.org/10.1117/12.2039659.

Klee, Anthony, et al. "Characterization of semiconductor-based optical frequency comb sources using generalized multiheterodyne detection." IEEE Journal of Selected Topics in Quantum Electronics 19.4 (2013): 1100711-1100711.

Sterczewski, Lukasz A., and Mahmood Bagheri. "Subsampling dual-comb spectroscopy." Optics Letters 45.17 (2020): 4895-4898.

\* cited by examiner

DUAL-COMB SPECTROSCOPY

RELATED APPLICATION DATA

This application is a continuation of U.S. patent application Ser. No. 17/518,874 filed Nov. 4, 2021, which claims priority of United Kingdom Application No. 2017556.8 filed Nov. 6, 2020, all of which are hereby incorporated herein by reference.

BACKGROUND OF THE INVENTION

The invention relates to dual-comb spectrometers and methods of processing measurement signals obtained by dual-comb spectrometers.

In dual-comb spectroscopy (DCS), an interrogating comb light beam is used to probe the sample, while a local oscillator comb light beam, with a slightly different comb mode spacing, is used to produce an interferogram which arises from multi-heterodyning the comb lines from the two beams. The interferogram is captured with a photodetector as an analog electronic signal. The discrete Fourier transform (DFT) of the interferogram, referred to as the multi-heterodyne beat note signal (MHBNS), consists of a number of evenly spaced narrow-band components (beat notes), each of which carries the information about magnitude and phase of the two optical comb lines that generated it. Quantum cascade lasers (QCL) are suitable sources for DCS over a relatively wide wavelength range. Namely, QCLs have been demonstrated with emission wavelengths from 2.6 µm up to 250 µm, i.e., covering almost the whole mid-infrared range (2.5 µm to 25 µm), as well as into the far infrared. Although not common, in principle interband cascade lasers (ICLs) can be used instead of QCLs. In other frequency ranges, other sources can be used, for example mode-locked rare-earth-doped fiber lasers.

A QCL is an electrically-driven semiconductor light source and is therefore sensitive to electrical noise. The frequency noise of QCLs degrades the optical accuracy of DCS and also degrades the signal-to-noise ratio (SNR) of the multi-heterodyne spectroscopic signal. DCS is still possible with such noise, since the noisy multi-heterodyne measurement signals can be digitally processed to reduce the noise, but a large memory is required on the digitizer to record long time traces.

An undesirable feature of existing DCS systems is the high cost of the digital electronics needed to process the measurement signals. Since the measurement signal captured by the photodetectors is analog, a digitizer is required. In view of the bandwidth requirements and the speed and volume of the data being collected in DCS, the digitizer specification is stringent, specifically for its analog-to-digital converters. For example, a bandwidth of 2 GS/s (8 GB/s) is typical. The memory requirements are also significant, since the quantity of data collected by DCS is massive.

An approach for canceling the common-mode noise from a QCL frequency comb is known from Cappelli et al [1], where common-mode noise is the component of noise that each beat note frequency component has in common with all other beat note frequency components. The multi-heterodyne signal is split into two signal branches. One branch contains a bandpass filter for selecting a single beatnote followed by a mixer to mix the single beatnote with a reference frequency, thereby frequency shifting the single beatnote by the reference frequency. The other branch does not process the multi-heterodyne signal, and so retains the frequency comb unchanged. The two branches are then recombined at a further mixer in order to mix the frequency-shifted single beatnote with the multi-heterodyne signal, the mixing automatically subtracting the common-mode noise from the multi-heterodyne signal. A radio frequency (RF) frequency comb is thus output with the common-mode noise removed, but the RF frequency comb is not harmonic.

WO 2020/030772 A1 [2] from the Technical University of Vienna discloses a method of stabilizing the mode spacing of a QCL (or ICL) comb, and thereby reducing DCS signal noise. An AC electrical signal is injected into the QCL cavity which is matched to the spatially dependent amplitude of the laser beat frequency and the round-trip time in the cavity.

SUMMARY OF THE INVENTION

According to one aspect of the invention there is provided a source module for a dual-comb spectrometer comprising:
a first semiconductor laser source operable to output a first light signal containing a first frequency comb consisting of a finite series of discrete frequencies separated by a first intermode beat frequency;
a first electrical driver connected to the first semiconductor laser source to apply a first drive current signal to cause generation of the first light signal;
a second semiconductor laser source operable to output a second light signal containing a second frequency comb consisting of a finite series of discrete frequencies separated by a second intermode beat frequency having a frequency offset from the first intermode beat frequency;
a second electrical driver connected to the second semiconductor laser source to apply a second drive current signal to cause generation of the second light signal;
an electrical output line from the first semiconductor laser source arranged to extract an AC modulation signal from the first semiconductor laser source that is generated by an internal light field of the first semiconductor laser source oscillating at the first intermode beat frequency;
an electrical reference generator operable to output a reference signal having a reference frequency; and
a frequency locking circuit arranged to combine the reference signal with the AC modulation signal extracted from the first semiconductor laser source so that the second intermode beat frequency of the second light signal is locked at a frequency offset equal to the reference frequency from the first intermode beat frequency of the first light signal, thereby to phase lock the second semiconductor laser source in one degree of freedom as a follower to the first semiconductor laser source which acts as its master.

Phase locking in one degree of freedom in this manner controls the frequency combs in the optical domain relative to each other (i.e. not absolutely) in one degree of freedom, so that the repetition frequency of the RF interferogram frequency comb generated at the sample detector by multi-heterodyning is stabilized. This approach can however beneficially be combined with measures for improving the absolute frequency stabilization of each of the laser sources.

In some implementations, the frequency locking circuit comprises an electrical mixer arranged to mix the reference signal with the AC modulation signal and thereby generate a sideband signal at a sideband frequency which is added to the second drive current signal supplied to the second semiconductor laser source.

An alternative for implementing the frequency locking is to use a phase-locked loop. The frequency locking circuit in this case comprises an oscillator controlled to generate an AC output signal at the second intermode beat frequency. Control of the oscillator is effected by a first electrical mixer arranged to mix the AC output signal from the oscilllator with the AC modulation signal extracted from the first semiconductor laser source and thereby generate a difference signal at a difference frequency, and a second electrical mixer arranged to mix the difference signal with the reference signal and thereby generate an error signal, the error signal being fed back to the oscillator to lock the second intermode beat frequency output by the oscillator at a frequency offset equal to the reference frequency from the first intermode beat frequency.

In certain embodiments, an electrical amplifier may be arranged to amplify the AC modulation signal, the reference signal and/or the sideband signal is used. In certain embodiments, one or more of the electrical mixers may be single sideband mixers operable to output one sideband.

The above source module can be incorporated in a dual-comb spectrometer further comprising a sample detector operable to output an electrical measurement signal and arranged to receive a combined light signal from superimposing the first and second light signals after at least the second light signal has traversed a sample space, wherein the measurement signal contains an interferogram frequency comb formed by heterodyne mixing of the first and second frequency combs contained in the first and second light signals and so comprises a plurality of beat note frequency components equally spaced in frequency by an amount equal to the difference between the first and second intermode beat frequencies. Optionally, the dual-comb spectrometer further comprises a normalizing detector arranged to receive a combined light signal from superimposing the first and second light signals after neither has traversed the sample space.

The dual-comb spectrometer may beneficially also include a phase-locked loop operable to phase lock the laser sources in a second degree of freedom. The phase-locked loop comprises:
  a filter arranged and configured to extract a beat note frequency component from said interferogram frequency comb obtained from the sample detector (or a reference frequency comb obtained from the optional normalizing detector);
  a reference source operable to generate a reference signal of defined frequency and phase;
  a phase comparator to determine a phase difference between the extracted beat note frequency component and the reference signal; and
  a feeback controller operable to generate an error correction signal from variation over time of the phase difference, the error correction signal being added to the second drive current signal, so that the second semiconductor laser source is phase locked in a further degree of freedom as a follower to follow the first semiconductor laser source which acts as its master.

In certain embodiments, the feeback controller is a proportional-integral-differential (PID) controller.

The dual-comb spectrometer may further comprise a noise cancelling circuit.

One implementation of a suitable noise cancelling circuit is to provide: a beat-note extracting bandpass filter configured to extract a beat note component from the interferogram frequency comb; and a noise-cancelling mixer arranged to receive and mix the extracted single beat note component and the plurality of beat note frequency components of the interferogram frequency comb, thereby to generate a noise-reduced version of the measurement signal from which common-mode noise has been subtracted, common-mode noise being a noise component that each beat note frequency component has in common with all other beat note frequency components.

Another implementation for a noise cancelling circuit, which is particularly useful in cases when a suitable noise-cancelling mixer is not commercially available as a single sideband mixer at the frequencies of the interferogram comb, is to provide: a beat-note extracting bandpass filter configured to extract a beat note component from the interferogram frequency comb; a first mixing frequency generator configured to generate a first mixing signal having a first mixing frequency; a first upshifting mixer arranged to upshift the extracted single beat note component output from the beat-note extracting bandpass filter to a higher frequency by mixing it with the first mixing signal; a second mixing frequency generator configured to generate a second mixing signal having a frequency that is offset from that of the first mixing signal by an integer multiple of the repetition frequency of the interferogram comb; a second upshifting mixer arranged to upshift the plurality of beat note frequency components in the measurement signal to higher frequencies by mixing them with the second mixing signal; a noise-cancelling mixer arranged to receive and mix the extracted upshifted single beat note component and the plurality of upshifted beat note frequency components of the interferogram frequency comb, thereby to generate a noise-reduced version of the measurement signal from which common-mode noise has been subtracted, common-mode noise being a noise component that each beat note frequency component has in common with all other beat note frequency components. The spectrometer of these embodiments may further comprise a bandpass or high-pass filter arranged between the second upshifting mixer and the noise-cancelling mixer and configured to pass a single frequency comb of the plurality of upshifted beat note frequency components to the noise-cancelling mixer and/or a further a bandpass or low-pass filter arranged to filter the output of the noise-cancelling mixer to remove an upshifted sideband duplicate of the measurement signal and pass the down-shifted noise-reduced version of the measurement signal.

The dual-comb spectrometer may further comprise a bandwidth compression circuit comprising: a harmonic reference comb generator configured to generate a harmonic reference frequency comb with a repetition frequency that is offset from the repetition frequency of the interferogram frequency comb by an offset frequency increment that is less than the repetition frequency of the interferogram frequency comb; and a bandwidth compressing mixer arranged to mix the interferogram frequency comb with the harmonic reference frequency comb to generate a down-converted version of the interferogram frequency comb that has its beat note frequency components equally spaced in frequency by an amount equal to the offset frequency increment, so that the down-converted version of the interferogram frequency comb is reduced in bandwidth by a factor equal to the ratio of the frequency spacing of the interferogram frequency comb and the offset frequency increment.

Provision of the bandwidth compression circuit allows the dual-comb spectrometer to be implemented with an analog-to-digital converter having a bandwidth less than the bandwidth of the interferogram frequency comb but greater than or equal to the bandwidth of the down-converted version of the interferogram frequency comb. The analog-to-digital converter is arranged to receive the down-converted version of the interferogram frequency comb as input.

The semiconductor laser comb sources may be quantum cascade lasers (QCLs) based on transitions between subbands, or interband cascade lasers (ICLs) based on transitions between bands.

In some embodiments, the drive current signals used to modulate the drive current supplied to the master semiconductor laser comb source is a voltage signal that is input to an electrical current driver for that source. This will likely be the most common implementation, but there are other ways to transfer a drive signal to the source. Other possibilities may be based on any parameter that can be varied so as to vary the refractive index of the source, e.g. broadband illumination of a part of the source to generate carriers in the relevant part of the semiconductor material. Modulating the temperature of the laser source can also be used in combination with refractive index modulation for additional control at longer timescales, e.g. to synchronize the sampling frequency with the repetition frequency of the interferogram comb.

According to another aspect of the invention, in a dual-comb spectrometer comprising:
- a first laser source operable to output a first light signal containing a first frequency comb consisting of a finite series of discrete frequencies separated by a first intermode beat frequency;
- a first electrical driver connected to the first semiconductor laser source to apply a first drive current signal to cause generation of the first light signal;
- a second laser source operable to output a second light signal containing a second frequency comb consisting of a finite series of discrete frequencies separated by a second intermode beat frequency having a frequency offset from the first intermode beat frequency;
- a second electrical driver connected to the second semiconductor laser source to apply a second drive current signal to cause generation of the second light signal; and
- a sample detector operable to output an electrical measurement signal and arranged to receive a combined light signal from superimposing the first and second light signals after at least the second light signal has traversed a sample space, wherein the measurement signal contains an interferogram frequency comb formed by heterodyne mixing of the first and second light signals and so comprises a plurality of beat note frequency components equally spaced in frequency by an amount equal to the difference between the first and second intermode beat frequencies, there is additionally provided a noise cancelling circuit comprising:
a beat-note extracting bandpass filter configured to extract a beat note component from the interferogram frequency comb;
a first mixing frequency generator configured to generate a first mixing signal having a first mixing frequency;
a first upshifting mixer arranged to upshift the extracted single beat note component output from the beat-note extracting bandpass filter to a higher frequency by mixing it with the first mixing signal;
a second mixing frequency generator configured to generate a second mixing signal having a frequency that is offset from the first mixing frequency by an integer multiple (m) of the repetition frequency of the interferogram comb; and a second upshifting mixer arranged to upshift the plurality of beat note frequency components in the measurement signal to higher frequencies by mixing them with the second mixing signal;
a noise-cancelling mixer arranged to receive and mix the extracted upshifted single beat note component and the plurality of upshifted beat note frequency components of the interferogram frequency comb, thereby to generate a noise-reduced version of the measurement signal from which common-mode noise has been subtracted, common-mode noise being a noise component that each beat note frequency component has in common with all other beat note frequency components Optionally, the dual-comb spectrometer further comprises a normalizing detector arranged to receive a combined light signal from superimposing the first and second light signals after neither has traversed the sample space. The noise cancelling circuit can then be duplicated to subtract common-mode noise from the signals output by each of the sample detector and normalizing detector.

The above-design of noise cancelling circuit is particularly useful in cases that a suitable noise-cancelling mixer is not commercially available as a single sideband mixer at the frequencies of the interferogram comb.

A bandpass or high-pass filter can be arranged between the second upshifting mixer and the noise-cancelling mixer and configured to pass a single frequency comb of the plurality of upshifted beat note frequency components to the noise-cancelling mixer. Moreover, a further bandpass or low-pass filter can be arranged to filter the output of the noise-cancelling mixer to remove an upshifted sideband duplicate of the measurement signal and pass the downshifted noise-reduced version of the measurement signal. An analog-to-digital converter can then be arranged to receive and digitize the filtered version of the measurement signal.

According to another aspect of the invention there is provided a method of removing common-mode noise from a measurement signal obtained by a dual-comb spectrometer comprising: a first laser source operable to output a first light signal containing a first frequency comb consisting of a finite series of discrete frequencies separated by a first intermode beat frequency; a second laser source operable to output a second light signal containing a second frequency comb consisting of a finite series of discrete frequencies separated by a second intermode beat frequency having a frequency offset from the first intermode beat frequency; and a sample detector operable to output an electrical measurement signal and arranged to receive a combined light signal from superimposing the first and second light signals after at least the second light signal has traversed a sample space, wherein the measurement signal contains an interferogram frequency comb formed by heterodyne mixing of the first and second frequency combs contained in the first and second light signals and so comprises a plurality of beat note frequency components equally spaced in frequency by an amount equal to the difference between the first and second intermode beat frequencies. The method of removing common-mode noise comprises:
extracting a beat note component from the interferogram frequency comb by passing the measurement signal through a beat-note extracting bandpass filter;
generating a first mixing signal having a first mixing frequency with a first mixing frequency generator;
upshifting the extracted single beat note component output from the beat-note extracting bandpass filter to a higher frequency by mixing it with the first mixing signal using a first upshifting mixer;

generating a second mixing signal with a second mixing frequency generator having a frequency that is offset from the first mixing frequency by an integer multiple of the repetition frequency of the interferogram comb; and upshifting the plurality of beat note frequency components in the measurement signal to higher frequencies by mixing them with the second mixing signal using a second upshifting mixer); and receiving and mixing the extracted upshifted single beat note component and the plurality of upshifted beat note frequency components of the interferogram frequency comb with a noise-cancelling mixer, thereby to generate a noise-reduced version of the measurement signal from which common-mode noise has been subtracted, common-mode noise being a noise component that each beat note frequency component has in common with all other beat note frequency components.

The above common-mode noise removal circuit and method can be embodied with analog RF components to achieve a stable, low-noise, harmonic multi-heterodyne RF comb. The approach is based on processing the electronic frequency comb(s) output by the photodetector(s), i.e. the acquired electronic signals, so is in principle applicable to any dual-comb spectrometer. In other words, this approach is not limited to dual-comb spectrometry performed with any particular laser source, so is implementable not only with semiconductor laser comb sources, but also any other comb sources, such as rare-earth-doped optical fiber lasers that find use in other parts of the electromagnetic spectrum. Since the approach is a processing method applied to the measurement signal, it can be implemented independently of any other measure, e.g. independently of any particular data acquisition method, e.g. whether or not the above-mentioned phase locking is applied for data acquisition.

It is further noted that while the embodiments of the noise compensation scheme described in this document are all based on analog processing which takes place prior to the signals being digitized, alternative embodiments could perform the same processing digitally, i.e., after signal digitization, through digital replication of what are described herein as analog components.

According to another aspect of the invention, in a dual-comb spectrometer comprising:

a first laser source operable to output a first light signal containing a first frequency comb consisting of a finite series of discrete frequencies separated by a first intermode beat frequency;

a first electrical driver connected to the first semiconductor laser source to apply a first drive current signal to cause generation of the first light signal;

a second laser source operable to output a second light signal containing a second frequency comb consisting of a finite series of discrete frequencies separated by a second intermode beat frequency having a frequency offset from the first intermode beat frequency; and a sample detector operable to output an electrical measurement signal and arranged to receive a combined light signal from superimposing the first and second light signals after at least the second light signal has traversed a sample space, wherein the measurement signal contains an interferogram frequency comb formed by heterodyne mixing of the first and second light signals and so comprises a plurality of beat note frequency components equally spaced in frequency by an amount equal to the difference between the first and second intermode beat frequencies, there is additionally provided a bandwidth compression circuit comprising:

a harmonic reference comb generator configured to generate a harmonic reference frequency comb with a repetition frequency that is offset from the repetition frequency of the interferogram frequency comb by an offset frequency increment that is less than the repetition frequency of the interferogram frequency comb; and a bandwidth compressing mixer arranged to mix the interferogram frequency comb with the harmonic reference frequency comb to generate a down-converted version of the interferogram frequency comb that has its beat note frequency components equally spaced in frequency by an amount equal to the offset frequency increment, so that the down-converted version of the interferogram frequency comb is reduced in bandwidth by a factor equal to the ratio of the frequency spacing of the interferogram frequency comb and the offset frequency increment.

Provision of the bandwidth compression circuit allows the dual-comb spectrometer to be implemented with an analog-to-digital converter having a bandwidth less than the bandwidth of the interferogram frequency comb but greater than or equal to the bandwidth of the down-converted version of the interferogram frequency comb. The analog-to-digital converter is arranged to receive the down-converted version of the interferogram frequency comb as input.

Optionally, the dual-comb spectrometer further comprises a normalizing detector arranged to receive a combined light signal from superimposing the first and second light signals after neither has traversed the sample space. The bandwidth compression circuit can then be duplicated to compress the bandwidth of the signals output by each of the sample detector and normalizing detector.

According to another aspect of the invention there is provided a method of reducing the bandwidth of a measurement signal obtained by a dual-comb spectrometer comprising: a first laser source operable to output a first light signal containing a first frequency comb consisting of a finite series of discrete frequencies separated by a first intermode beat frequency; a second laser source operable to output a second light signal containing a second frequency comb consisting of a finite series of discrete frequencies separated by a second intermode beat frequency having a frequency offset from the first intermode beat frequency; and a sample detector operable to output an electrical measurement signal and arranged to receive a combined light signal from superimposing the first and second light signals after at least the second light signal has traversed a sample space, wherein the measurement signal contains an interferogram frequency comb formed by heterodyne mixing of the first and second frequency combs contained in the first and second light signals and so comprises a plurality of beat note frequency components equally spaced in frequency by an amount equal to the difference between the first and second intermode beat frequencies. The method of reducing the bandwidth of a measurement signal obtained by a dual-comb spectrometer comprises:

generating a harmonic reference frequency comb with a harmonic reference comb generator, the harmonic reference comb having a repetition frequency that is offset from the repetition frequency of the interferogram frequency comb by an offset frequency increment that is less than the repetition frequency of the interferogram frequency comb; and mixing the interferogram frequency comb with the harmonic reference frequency comb in a bandwidth compressing mixer to generate a down-converted version of the interferogram frequency comb that has its beat note frequency components equally spaced in frequency by an amount equal to the offset frequency increment, so that the down-converted version of the interferogram frequency comb is reduced in bandwidth by a factor equal to the ratio of the frequency spacing of the interferogram frequency comb and the offset frequency increment.

Since the bandwidth compression is applied to the electronic frequency comb(s) output by the sample and/or normalizing photodetector(s), it is in principle applicable to any dual-comb spectrometer. In other words, this approach is not limited to a dual-comb spectrometer with any particular laser source, so is implementable not only with semiconductor laser comb sources, but also any other comb sources, such as rare-earth-doped optical fiber lasers that find use in other parts of the electromagnetic spectrum. Since the approach is a processing method applied to the measurement signal, it can be implemented independently of any other measures, namely independently of any particular data acquisition method, such as the above-mentioned phase locking, and independently of any other methods, such as the above-mentioned common-mode noise removal scheme. However, for the proposed bandwidth compression to be possible, it is a pre-condition that the signal quality is good enough to allow compression to take place without losing signal content, so it may be necessary for example to ensure that the comb sources have sufficient frequency stability (either relative to each other with the proposed phase locking scheme or absolutely by suitable design of each comb source) and/or sufficiently low noise content (e.g., by applying the proposed noise compensation scheme before the bandwidth compression).

It is further noted that while the embodiments of the bandwidth compression scheme described in this document are all based on analog processing which takes place prior to the signals being digitized, alternative embodiments could perform the same processing digitally, i.e., after signal digitization, through digital replication of what are described herein as analog components.

The three principal measures described above, namely phase locking the laser sources (in one or two degrees of freedom), processing the measurement signal to cancel common-mode noise in the multi-heterodyne signal and processing the measurement signal to compress the electronic signal bandwidth, can be applied independently of each other. However, these three measures are compatible with each other and the greatest benefit can be obtained when all three are combined. However in principle they can be applied in any permutation.

The frequency stabilization of the interferogram by phase locking and the cancelling of common-mode noise each contribute to an improvement in the analog signal quality, so individually, and more preferably in combination, allow a greater amount of down-conversion, i.e. compression, of the multi-heterodyne signal than would otherwise be possible. However, it is noted that improved absolute frequency stabilization of the sources produced by other means not subject of the present disclosure can also be combined with any of the measures disclosed herein.

Importantly, the signal quality improvements achievable with each of these three measures individually and in combination can enable the real-time application of coherent averaging during data acquisition. This is highly significant, since real-time coherent averaging can drastically decrease the amount of data that needs to be handled, both simplifying the real-time processing of the signal and reducing the amount of data that needs to be stored both at the different intermediate stages of the real-time and subsequent processing and finally for subsequent use. Any subsequent processing, i.e. post-processing is also simplified in view of the reduced amount of data.

BRIEF DESCRIPTION OF THE DRAWINGS

This invention will now be further described, by way of example only, with reference to the accompanying drawings.

DETAILED DESCRIPTION

Definitions

Frequency comb: a form of laser output consisting of a series of discrete, equally spaced frequencies, referred to as teeth, lines, or modes.

Free spectral range (FSR): the spacing in optical frequency between two neighboring comb teeth. In a dual-comb spectrometer, the respective FSRs of the local oscillator and interrogator are almost the same, i.e. only marginally different, perhaps differing only by a relative value of 1/5000. Hence, in DCS we usually refer to "the" FSR even though there are two marginally different FSRs. FSR is labelled as $f_{rep}$ in the following detailed description.

Beat frequencies/notes: a term used to describe the heterodyne frequencies generated by beating of the local oscillator and interrogation beams in an optical heterodyne system as a consequence of the difference in their FSRs.

Repetition frequency: Frequency difference defining the spacing between the equally distant frequencies comprising an RF frequency comb. It is labelled as $\Delta f_{rep}$ in the following detailed description.

RF: We refer to the frequency range of the interferogram comb as lying in the RF, following normal usage, although the frequency range may not in all cases be in the radio frequency range (i.e. 20 kHz-300 GHz) as would be understood by an RF engineer. In other words, we are using RF mainly as a convenient label or proxy for 'electronic' in contradistinction to 'optical'.

DESCRIPTION OF FIGURES

Figure 1:
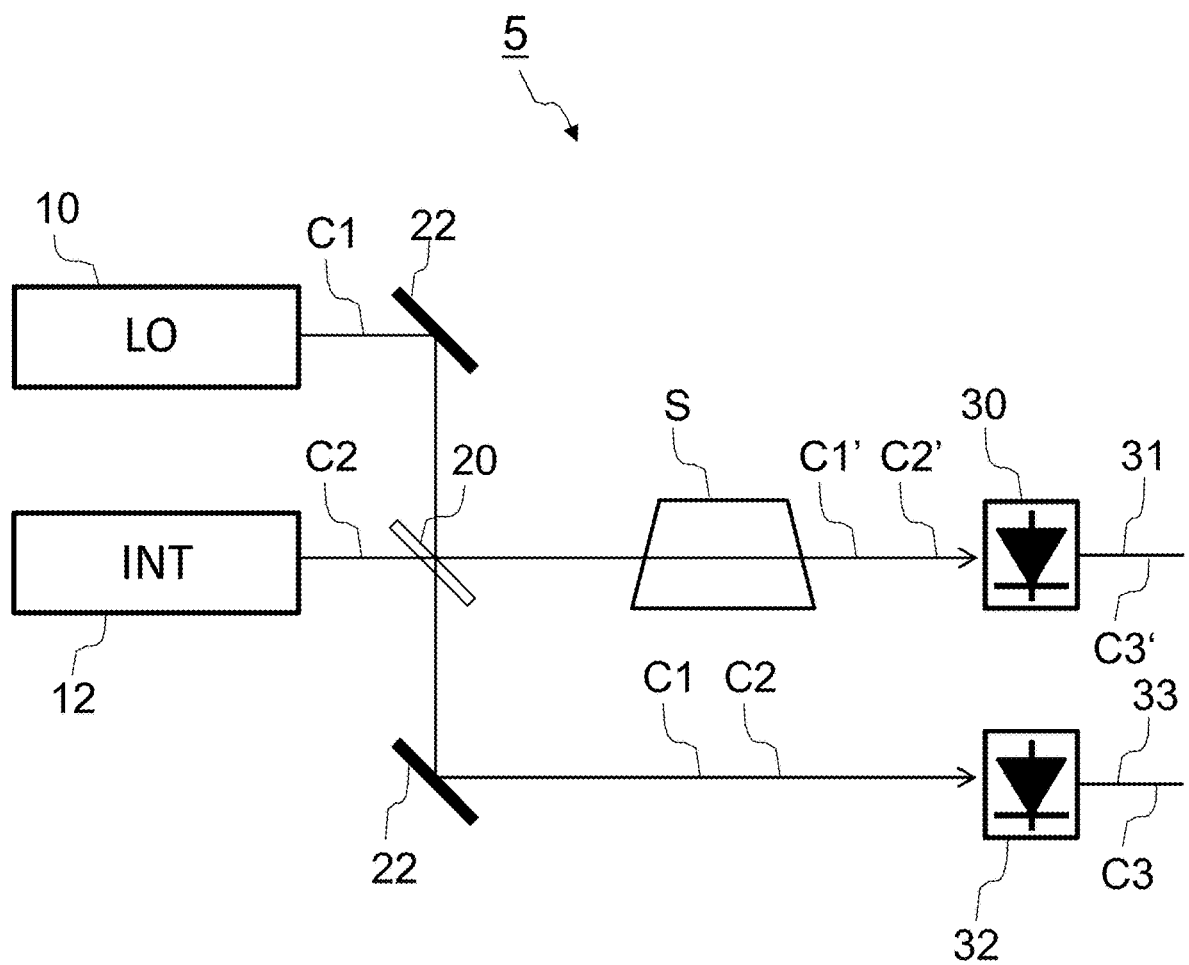
FIG. 1 is a schematic drawing of a DCS instrument with first and second laser comb sources.

FIG. 1 is a schematic drawing of a dual-comb spectrometer 5 in a configuration in which both the interrogating comb beam and the reference beam (also referred to as the local oscillator—LO—beam) are transmitted through the sample S. This approach measures only the amplitude response of the sample, i.e., its absorption. An alternative to the set-up of FIG. 1 is a configuration in which only the interrogating comb beam is transmitted through the sample S, while the LO beam does not, which measures both the amplitude and phase response of the sample. Embodiments of the disclosure are also applicable to this alternative set-up, although not further detailed herein. The two configurations differ only in respect of how the comb signals C1, C2 are routed via suitable beam splitters 20 and plane mirrors 22.

A dual-comb spectrometer 5 is based around a pair of laser sources, namely a QCL 10 serving as a local oscillator and a QCL 12 serving as the interrogator (INT). The two QCLs 10, 12 generate respective light signals containing respective frequency combs C1 and C2, each having frequencies consisting of a finite series of discrete frequencies. Combining the first and second light beams results in the photocurrent output by a photodetector receiving such a combined beam generating a superposition of sinusoidal oscillations in the photocurrent, with a set of frequencies evenly spaced by the difference between the first and second spacings, representing a third frequency comb which is an interferogram of the first and second frequency combs formed by heterodyne mixing at the detector. The interferogram frequency comb is thus shifted in frequency by several orders of magnitude to lower frequencies relative to the first and second frequency combs.

The QCLs 10, 12 are driven by respective current drivers for supplying suitable drive currents to the QCLs. In one real example, each laser emits around 300-400 mW of average power at 1.1 A (typical drive current). The output beams from QCLs 10 and 12 are split and guided respectively by a suitably arranged beam splitter 20 and two plane mirrors 22 so that the LO and INT frequency combs C1, C2 traverse the sample S which attenuates their amplitude through absorption and also induces a phase shift, which is equal for the two combs and hence carries no information as their phase difference remains constant. We label the LO and INT frequency combs after passage through the sample with an additional prime symbol as C1', C2'. The interrogating frequency comb C2' and the local oscillator frequency comb C1' are detected as a combined comb C3' at an optoelectronic photodetector 30, referred to as the sample detector, which outputs an analog electronic signal through output line 31 having an amplitude proportional to the incident light intensity. A reference combined comb C3 is also detected at a further photodetector 32, referred to as the normalizing detector, in order to provide a basis for normalizing the combined comb signal C3'. The normalizing detector 32 also outputs an analog electronic signal through an output line 33 having an amplitude proportional to the incident light intensity on that photodetector. The reference, normalizing signal is based on combined detection of the local oscillator comb C1 and the interrogating frequency comb C2 to generate RF comb C3. It will be appreciated that equivalent optical fiber components could be used instead for manipulating the beams through the sample and onto both the sample detector 30 and normalizing detector 32. The two QCL combs are thus heterodyned on both photodiodes 30 and 32 leading to respective RF combs C3' and C3 being contained in the electrical signals output from the respective photodiodes. The sample photodetector 30 measures the interferogram C3' of the combs C1', C2' (where combs C1 and C2 have been attenuated and phase-shifted to become combs C1', C2' by traversing the sample S), whereas the normalizing detector 32 measures the interferogram C3 of the combs C1, C2 (without influence of the sample S).

The signal collected by the normalizing detector 32 serves to cancel or suppress common mode fluctuations between the QCLs, e.g., due to relative fluctuations between the (optical) output powers of the two QCLs. In principle the reference branch of the dual-comb spectrometer is not needed, i.e., only the path through the sample is required. However, in practice, inclusion of a reference branch is desirable, e.g., in case the sample is completely absorbing at some wavelengths, then any feedback control that depends on analysing the detector signal will disappear, causing a temporary break in the control loop.

Figure 2:
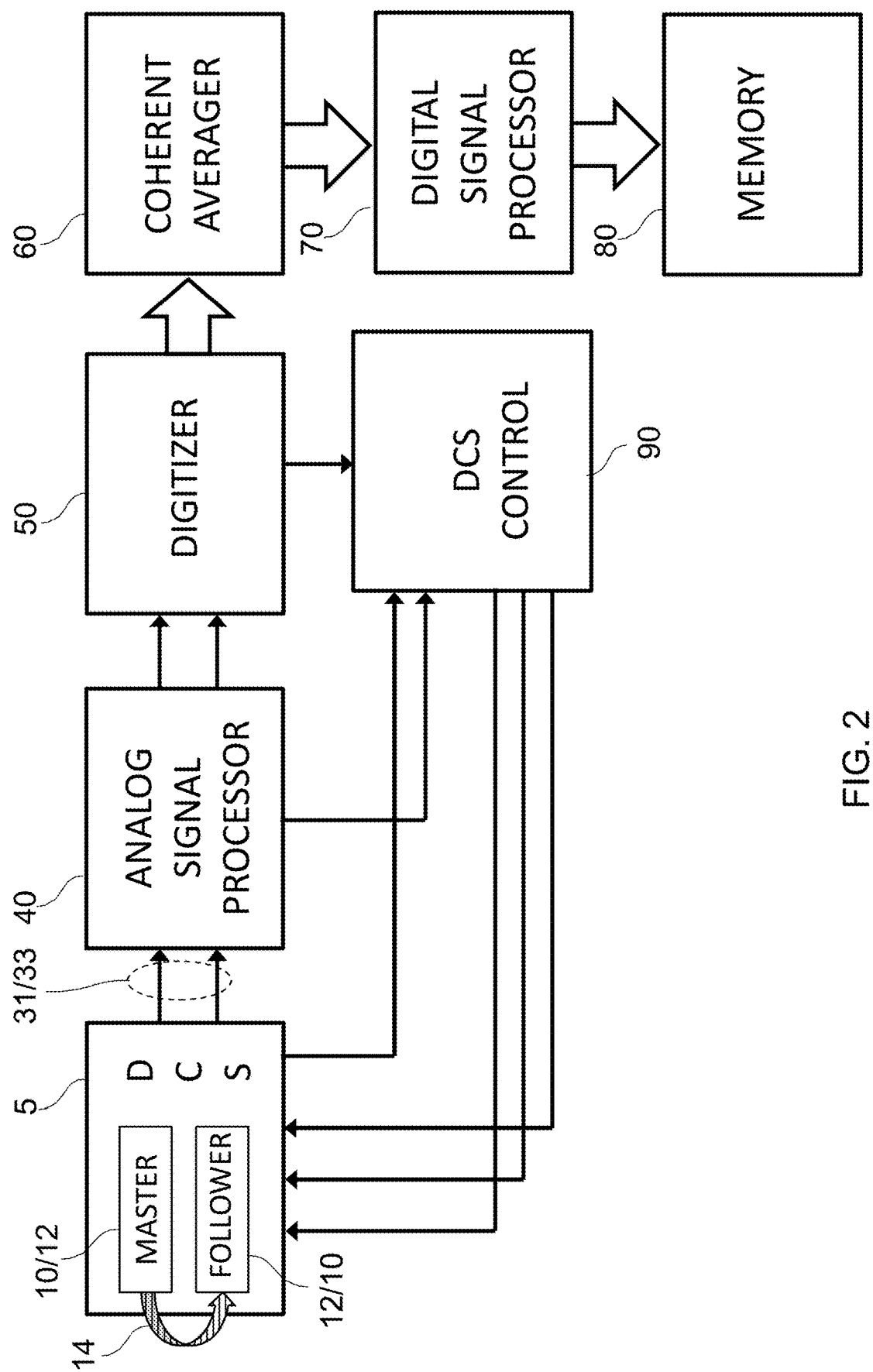
FIG. 2 is a block diagram of the DCS instrument of FIG. 1 together with its associated acquisition electronics and control electronics including a master-follower locking of the laser comb sources.

FIG. 2 is a block diagram of the DCS instrument 5 of FIG. 1 together with associated acquisition electronics and control electronics. The analog electronic signals 31, 33 output from the DCS instrument 5 are first subject to some analog pre-processing prior to their digitization, indicated schematically in FIG. 2 with an analog signal pre-processing unit 40. The analog pre-processing may comprise in line amplification in each of lines 31 and 33 with respective amplifiers as well as some in line filtering with suitable low pass or bandpass filters. An example pass band is 50-1050 MHz. The filtering serves to exclude frequencies from outside the range of the interferogram frequency comb C3 or C3' on the lines 33 and 31 respectively.

After the analog signal processing, the analog electronic signals are supplied to a digitizer 50 which incorporates respective analog-to-digital converters (ADCs) which digitize the signals and supply them onward for digital signal processing. In one example, the ADCs are 14-bit and operated with a sampling rate of 2 Giga samples per second (GS/s).

The first stage of digital signal processing after digitization is coherent averaging (CA) performed by a CA unit 60. CA will not be appropriate in all cases, so in some systems there may be no CA unit, or it may be inactive for some acquisition types. After coherent averaging, the signal is supplied to a general digital signal processor (DSP) unit 70, such as comprising one or more central processing units (CPUs), graphics processing units (GPUs) or field programmable gate arrays (FPGAs). The processed signal output from the DSP unit 70 is stored in suitable mass data storage shown as memory 80.

In addition to the above-mentioned signal acquisition, processing and storage electronics, the electronics further comprises a control unit 90 which has the function of controlling the DCS instrument 5 to ensure the data is acquired as desired. For example, a control unit 90 may be responsible for temperature stabilization of the QCLs 10, 12 with an appropriate control loop. Namely, the QCLs may be housed in respective water-cooled enclosures with a thermoelectric element in each housing to set and be maintained by the control unit 90 at a temperature of, for example, 25° C. based on temperature sensor readings supplied to the controller 90. As schematically indicated, the control unit 90 may receive signals from the DCS instrument 5, the analog signal pre-processing unit 40 and/or the digitizer 50 which are used in a feedback loop to control elements of the DCS instrument 5. For example, the QCL output power may be controlled so that the power reaching the photodetectors 30, 32 is maintained within the linear response range of the photodetectors 30, 32 and that the powers reaching each photodetector are approximately equal. This feeback control may be based on receiving power signals either from the analog signal processing unit or the digitizer. In the case that a waveform generator (WFG) is used to drive the QCL drivers with defined functional forms of drive voltage which the drivers convert into current, e.g., coordinated voltage ramps, the DCS control unit 90 may also be responsible for controlling the WFG. The various digital electronics components, including the digitizer 50, coherent averager 60, digital signal processor 70 and memory 80 are connected by a suitable bus, such as a PCIE (Peripheral Component Interconnect Express) bus. An example suitable bus bandwidth is 3.2 GbB/s.

FIG. 2 also schematically shows that the two QCLs 10 and 12 are in a master-follower relationship to phase lock them to each other. The master-follower relationship is implemented with schematically shown phase locking features 14 as well as a frequency demodulator (not shown—but may be integrated in the digitizer 50 or be in separate hardware), and a proportional-integral-differential (PID) controller 92 in the control unit 40. The implementation of the master-follower phase locking of the QCLs 10, 12 is described further below with reference to FIGS. 4 and 5. It is noted that there are two pairs of roles assigned to the two QCLs, namely local oscillator/interrogator and master/follower. These roles may be assigned in any permutation; that is the local oscillator could be the master or the follower and similarly for the interrogator.

Figure 3:
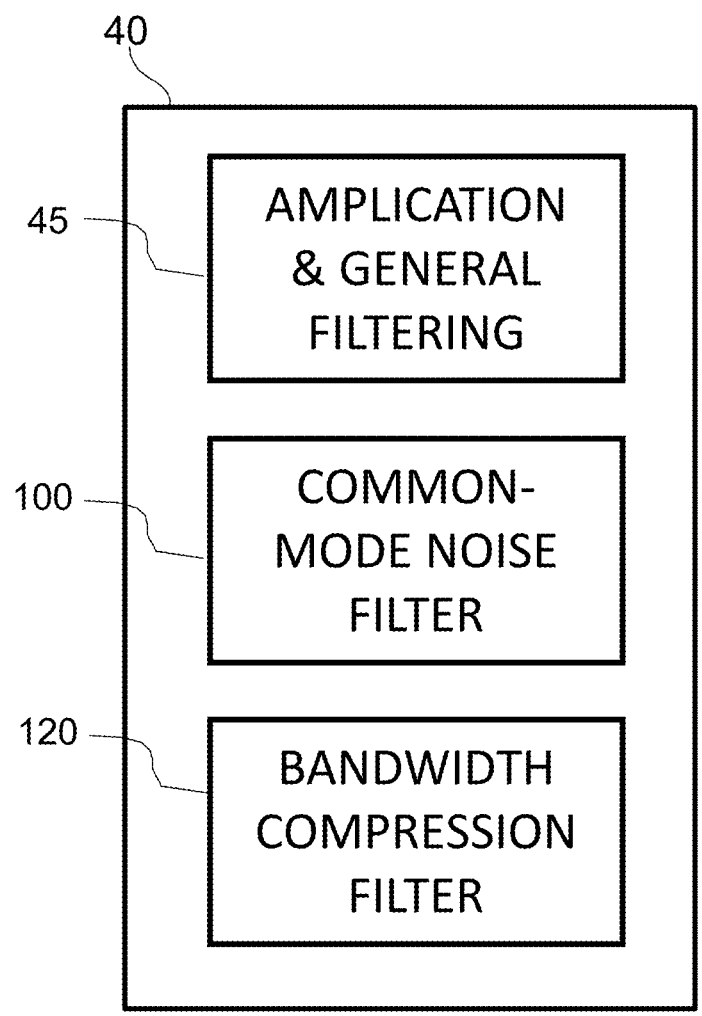
FIG. 3 is a schematic diagram of internal features of the analog signal pre-processing unit of FIG. 2 including common-mode noise compensation filter and bandwidth compression filter.

FIG. 3 is a schematic diagram of internal features of the analog signal pre-processing unit 40. The analog processing may include the above-described standard features of amplification and edge or bandpass filtering as shown schematically with the amplification and general filtering feature 45. In addition, the analog processing may include the additional functions of a common-mode noise compensation filter 100 and a bandwidth compressor 120. The common-mode noise compensation filter 60 is described further below with reference to FIGS. 7 and 8. The bandwidth compressor 62 is described further below with reference to FIG. 10.

Figure 4:
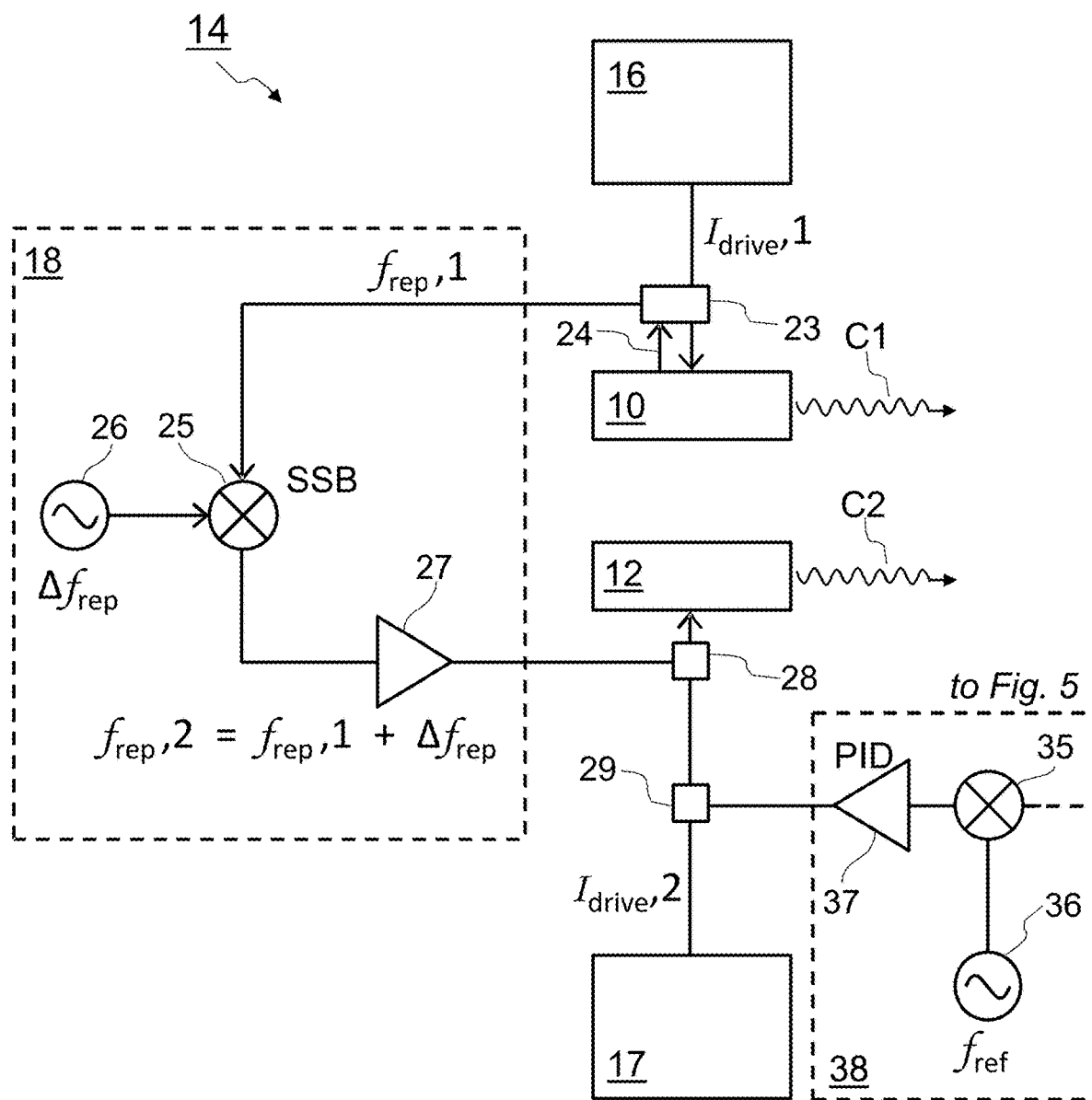
FIG. 4 shows details of a master-follower set-up as shown in FIG. 2 including a frequency locking circuit.
Figure 5:
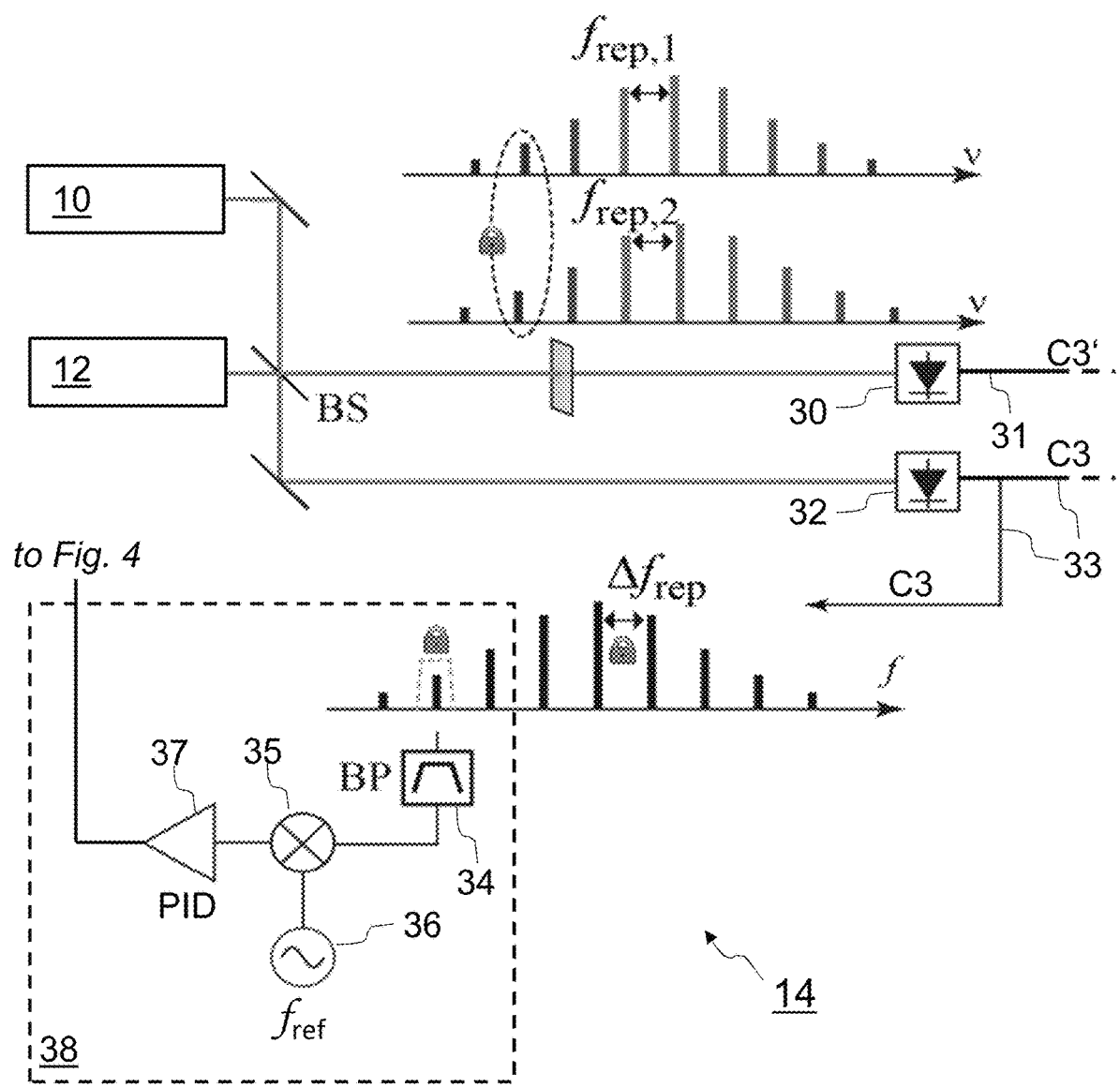
FIG. 5 shows further details of the master-follower set-up as shown in FIG. 2.

FIGS. 4 and 5 shows a DCS instrument 5 with a master-follower set-up 14 of the QCLs 10 and 12 to achieve phase locking between the first and second QCLs 10 and 12. The first QCL 10 is driven by an electrical current driver 16 that is connected to apply a suitable DC drive current signal $I_{drive,1}$ for generation of the frequency comb C1. The first QCL 10 is free-running and no RF-injection is done. The second QCL 12 is driven by an electrical current driver 17 that is connected to apply a suitable DC drive current signal $I_{drive,2}$ for generation of the frequency comb C2. As well as the DC component provided by the electrical current driver 17, the drive signal has an AC component to define the frequency comb C2. The AC component is derived from the first QCL 10 in order to phase lock the second QCL 12 to the first QCL 10 in a first degree of freedom. Namely, the AC component of the drive current supplied to drive the second QCL 12 is provided by the components shown collectively in box 18 (see FIG. 4). Even though the drive current supplied to the first QCL 10 by the electrical current driver 16, $I_{drive,1}$, is DC only, the current nevertheless carries an AC component oscillating at a frequency $f_{rep,1}$ which is generated by the internal light field of the driven first QCL 10 from the intermode beating of the comb lines that are lasing in the first QCL 10. This effect is exploited as follows. The AC component of frequency $f_{rep,1}$ is extracted on tap line 24. It is separated out from the DC component with a bias-tee 23. The AC component signal bearing the instantaneous oscillation frequency $f_{rep,1}$ of the QCL 10 is supplied to a single intermode sideband (SSB) mixer 25. Optionally, the signal may be filtered and/or amplified prior to being input into the SSB mixer 25. In an alternative, the tap line 24 could lead directly to the SSB mixer 25 in which case the bias tee 23 could be omitted, which would also mean that the drive current $f_{drive,1}$ would be supplied directly to the first QCL 10. The SSB mixer 25 mixes the master oscillation frequency signal of frequency $f_{rep,1}$ with a signal of reference frequency $\Delta f_{rep}$ which ultimately defines the mode spacing of the RF combs. The reference frequency $\Delta f_{rep}$ is generated by an RF generator 26. In an example test system, the reference frequency $\Delta f_{rep}$ was ~45 MHz. The SSB mixer 25 outputs the upshifted sideband at frequency $f_{rep,2}=f_{rem}\ \Delta f_{rep}$. Here we have taken the SSB mixer 25 to be an SSB+ mixer (upshifting).

However, if the natural mode spacing of the follower comb is lower than the mode spacing of the master comb, then an SSB– (downshifting) mixer should be used instead. The SSB mixer's output is then supplied to the second QCL 12 as the AC component of its drive current signal via a suitable bias-tee 28 which combines the AC component with the DC component. In addition, an amplifier 27 is arranged in the output line of the SSB mixer 25 to amplify the AC modulation at $f_{rep,2}$ before it is applied to the second QCL 12. Optionally, filtering may be performed at the input and/or output of the amplifier 27. In an example test system, the AC component was amplified to ~5 dBm. The second intermode beat frequency $f_{rep,2}$ of the second QCL 12 is thus driven at a frequency offset by $\Delta f_{rep}$ from the first intermode beat frequency $f_{rep,1}$ of the first QCL 10, thereby phase locking the second QCL 12 in one degree of freedom to the first QCL 10, so the first QCL 10 is acting as the master and the second QCL 12 as the follower.

Figure 4A:
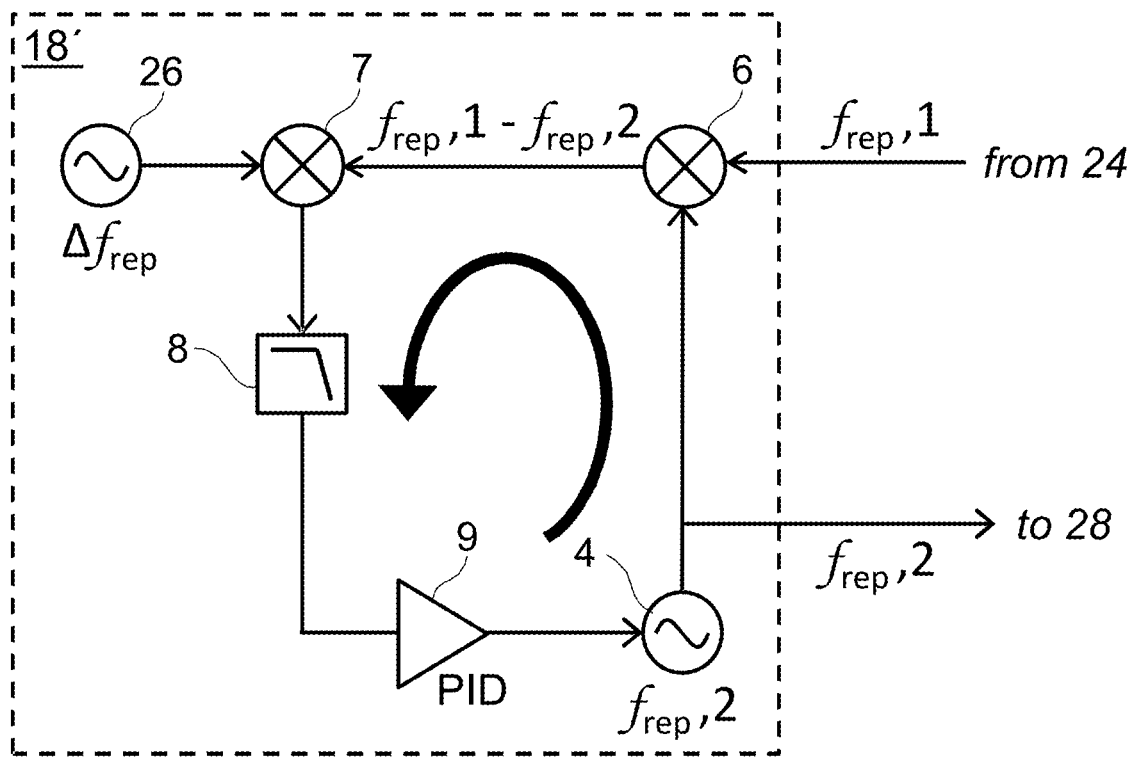
FIG. 4A shows an alternative frequency locking circuit.

FIG. 4A shows an alternative for stabilizing the repetition rate of the interferogram comb. Instead of the mixer circuit 18 shown in FIG. 4, a phase-locked loop (PLL) circuit 18' as shown in FIG. 4A is used. A voltage-controllable oscillator such as a dielectric resonator oscillator—DRO—4 is operable to output an AC output signal at a particular output frequency governed by whatever input voltage is supplied to the DRO 4. The DRO 4 is controlled by the PLL to lock the DRO output frequency to the desired second intermode beat frequency $f_{rep,2}$, namely a frequency that is offset by the reference frequency $\Delta f_{rep}$ from the first intermode beat frequency $f_{rep,1}$. The DRO output signal can then be directly injected into the second QCL 12. To provide the feedback, a first mixer 6 is arranged to mix the AC output signal from the DRO 4 with the AC modulation signal at frequency $f_{rep,1}$ that has been extracted from the lasing first QCL 10 on tap line 24. The first mixer 6 thus generates a difference signal at a difference frequency $f_{rep,1}-f_{rep,2}=\Delta f_{rep,12}$. A second mixer 7 is arranged to mix the difference signal with the reference signal from RF generator 26. The second mixer 7 thus generates at a frequency $\Delta f_{rep} \pm \Delta f_{rep,12}$. One of the mixing frequencies is removed by a suitable filter 8, illustrated as a low pass filter for removing the higher frequency mixer output, and the other supplied as input to a PID controller 9 that is configured to generate an error signal and supply the error signal as feed back to adjust the voltage applied to the DRO 4, thereby locking the DRO output frequency to the desired second intermode beat frequency $f_{rep,2}$. As an alternative to a DRO, any other type of voltage-controllable oscillator may be used.

Phase locking in a second degree of freedom is achieved by adding a correction signal to the DC drive current that is applied to at least one of the QCLs 10, 12 via a feeback loop from the detector-side of the spectrometer with a phase-locked loop (PLL) 38 (see FIGS. 4 and 5). Referring to FIG. 5, a portion of the RF comb C3, i.e., the analog signal from one of the photodetectors, is tapped off and supplied to a bandpass filter 34 to extract one comb line of the multiheterodyne beat signal. (A variant would be for the bandpass filter 34 to be configured to extract two or more comb lines.) The tap is shown here to be from the signal of photodetector 32, i.e., the signal from the reference branch, i.e., the branch that does not contain the sample. An alternative would be to use the photodetector 30. Another alternative would be to provide an additional photodiode (not shown) and heterodyne both of the QCLs with a CW laser and mix the two beats. We show by way of example that the second line of the RF comb spectrum is tapped off, but any other line can be used as desired. In the drawing, we mark the tapped off comb line with a lock symbol both in the RF domain from comb C3, and also of the two combs C1 and C2 in the optical domain. In our test system, the extracted comb line had a frequency of ~200 MHz. A phase comparator 35 is then used to compare the phase of the extracted comb line to the phase of a reference signal of frequency $f_{ref}$ generated by a reference oscillator 36 that outputs a signal of defined frequency and phase. The determined phase difference, which varies over time, is supplied to a suitable feedback controller, such as a proportional-integral-derivative (PID) controller 37, which determines an error correction signal from the time-varying phase difference signal, thereby completing a phase-locked loop (PLL). The error correction signal output from the PID controller 37 is added to the DC drive current signal from the second current driver 17 via a bias tee 29 to provide a bias modulation of the DC drive current applied to the second QCL 12 (see FIG. 4). The follower QCL 12 is thus phase locked in a second degree of freedom to follow the master QCL 10. It is noted that the two phase-locking mechanisms can be implemented independently of each other, i.e., either one may be implemented on its own without the other, or both in combination as illustrated.

In an example DCS instrument according to the above design, the following components and parameters are used. The photodiodes are fast mercury-cadmium-telluride (MCT) photodiodes with a 1 GHz bandwidth obtained from Vigo System SA. The incident power on the photodiodes is approximately 1 mW. The master QCL is operated at a temperature of 23° C. and is driven at an average drive current of ~1420 mA. The resulting comb spectrum is centered around 1275 cm$^{-1}$ spanning about 40 cm$^{-1}$. The spacing between the comb modes is $f_{rep,1}$=9.70 GHz. This frequency is detected electrically from the intermode beat signal extracted from the modulation of the injected current in the laser. A bias-tee is used to enable simultaneous direct current drive of the QCL and RF extraction of the intermode beat signal. The extracted signal has a power of roughly ~80 dBm. The follower QCL is phase-locked to the master to achieve their relative stabilization as described elsewhere in this document. The follower QCL is operated at an average drive current of ~1050 mA and a temperature of 24° C. and emits a comb spectrum spanning from 1290 cm$^{-1}$ to 1300 cm$^{-1}$. Its mode spacing is 45 MHz higher than that of the master QCL, i.e., $\Delta f_{rep}$=45 MHz. The operation points of the two QCLs are slightly varied depending on the time of the measurement to ensure a low-noise comb operation for each of them (characterized by a narrow intermode beat signal <10 kHz), as the same operating point does not always result in the same comb state. The comb state is chosen to limit the bandwidth of the generated multi-heterodyne beat signal to less than 1 GHz with 15 lines. The follower QCL is mounted in a dedicated package that is optimized for efficient RF extraction/injection. Injecting an RF signal with a frequency that is close to the native mode spacing of the QCL can force the QCL to operate at the injected frequency (RF injection locking), therefore locking its mode spacing. The optimized package provides an injection locking range of 800 kHz for an injected RF power of 15 dBm.

The master-follower scheme described with reference to FIGS. 4 and 5 was implemented in an example DCS instrument by stabilizing the above-discussed RF comb line (the selected RF comb line has a frequency of ~200 MHz) to a reference signal using the above-discussed PLL. The phase noise of different lines of the reference RF comb is measured using a phase noise analyzer.

Figure 6:
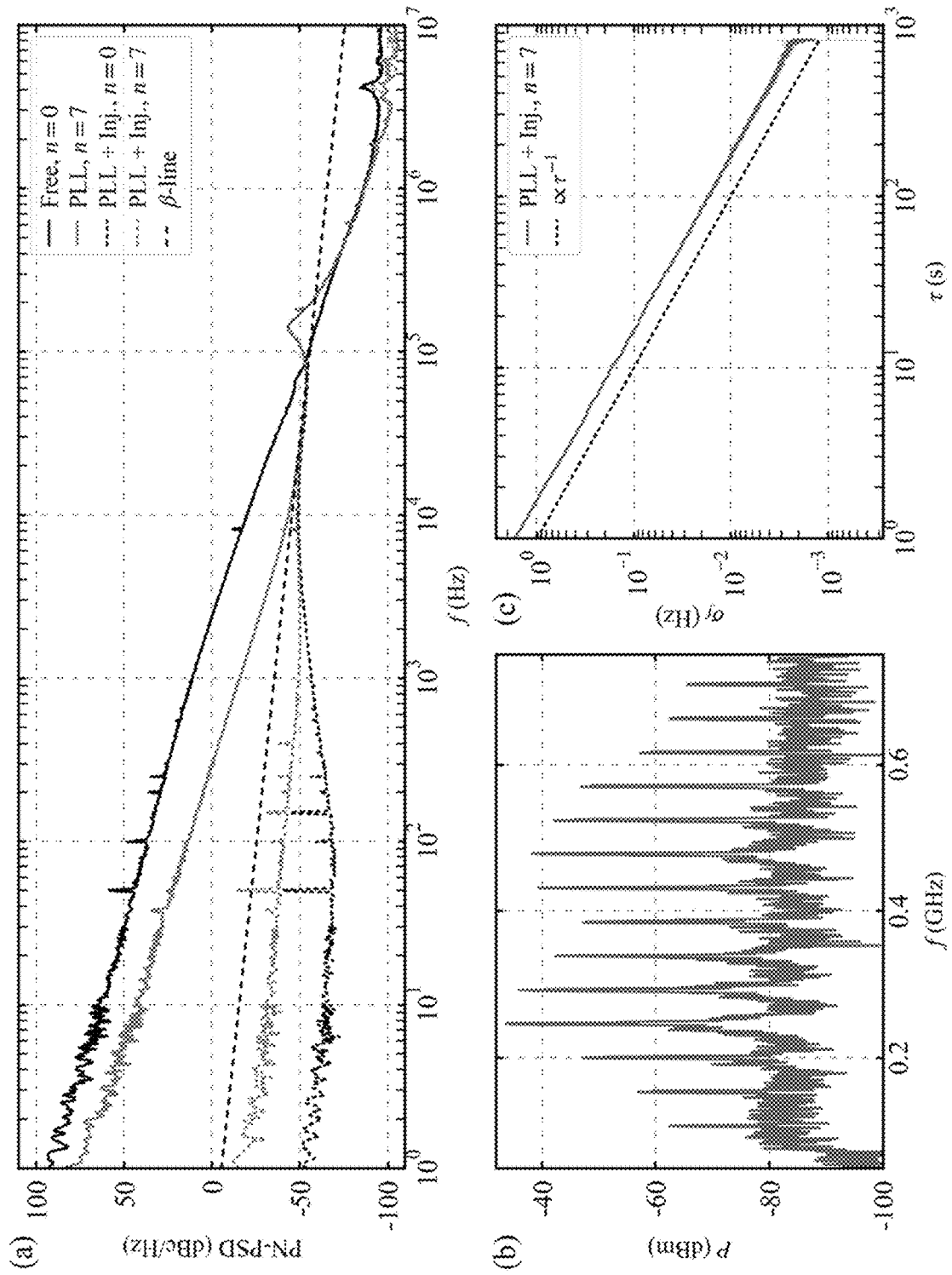
FIG. 6 shows experimental results from an example test system for evaluating the master-follower stabilization set-up.

FIG. 6 shows experimental results from our test system for evaluating the master-follower stabilization set-up. Panel (a) plots the phase noise (PN) power spectral density (PSD) of different lines of the RF comb under various operating conditions, namely:

free-running QCLs ("free")—i.e., prior art situation
  with the PLL activated ("PLL")—i.e., feature 38 of FIGS. 4 & 5
  with the PLL and RF injection locking ("PLL+Inj.")—i.e., plus feature 18 in FIG. 4

Panel (b) shows a representative example spectrum of a multi-heterodyne beat, the graph plotting power in dBm against frequency in GHz. Panel (c) is a graph plotting Allan deviation in Hz against integration time T in seconds of the frequency of the n=7 line of the RF comb. Although not shown, it is noted that the n=1 and n=8 lines overlap the n=7 line almost exactly. The line n=0 at 200 MHz used for the phase-lock shows a noise reduction of 140 dB at 1 Hz Fourier frequency as a result of the stabilization. The locking bandwidth is 100 kHz, as assessed from the servo bump. Other lines, e.g. n=7 at 530 MHz, show only ~15 dB noise reduction when the PLL alone is activated. The cause of the remaining noise is probably relative frequency fluctuations between the mode spacing of the two QCL combs, which was not stabilized at this point.

In a second step, relative stabilization between the mode spacing of the two QCL combs was added by RF extraction/injection, with a mode spacing difference of 46.98 MHz. The locking range is in the order of 200 kHz, enabling small tuning of $\Delta f_{rep}$. With the combined RF injection locking of the mode spacing of the follower QCL and phase-lock of the RF comb line at 200 MHz, the other lines of the multi-heterodyne spectrum show a large phase noise reduction (see Panel (a) of FIG. 6). We inferred that the excess noise of the other lines in comparison to the locked line is due to the residual noise of the mode spacing difference $\Delta f_{rep}$ between the two QCL combs. The long-term frequency stability of the stabilized RF comb was investigated by counting the frequency of different lines. Synthesized signals at 205 MHz and 550 MHz were mixed with the RF comb to down-convert the lines n=1, 7, 8, located at 248 MHz, 535 MHz and 583 MHz, respectively, to frequencies below 50 MHz so that they can be simultaneously counted on a multi-channel Tr-type frequency counter (FXM-50 from Menlo Systems GmbH). Allan deviations calculated for these three lines from the recorded time series show Hz level fluctuations at 1 second averaging time, averaging down to below 10 mHz (millihertz) at integration times longer than 200 s (see Panel (c) of FIG. 6).

Figure 7:
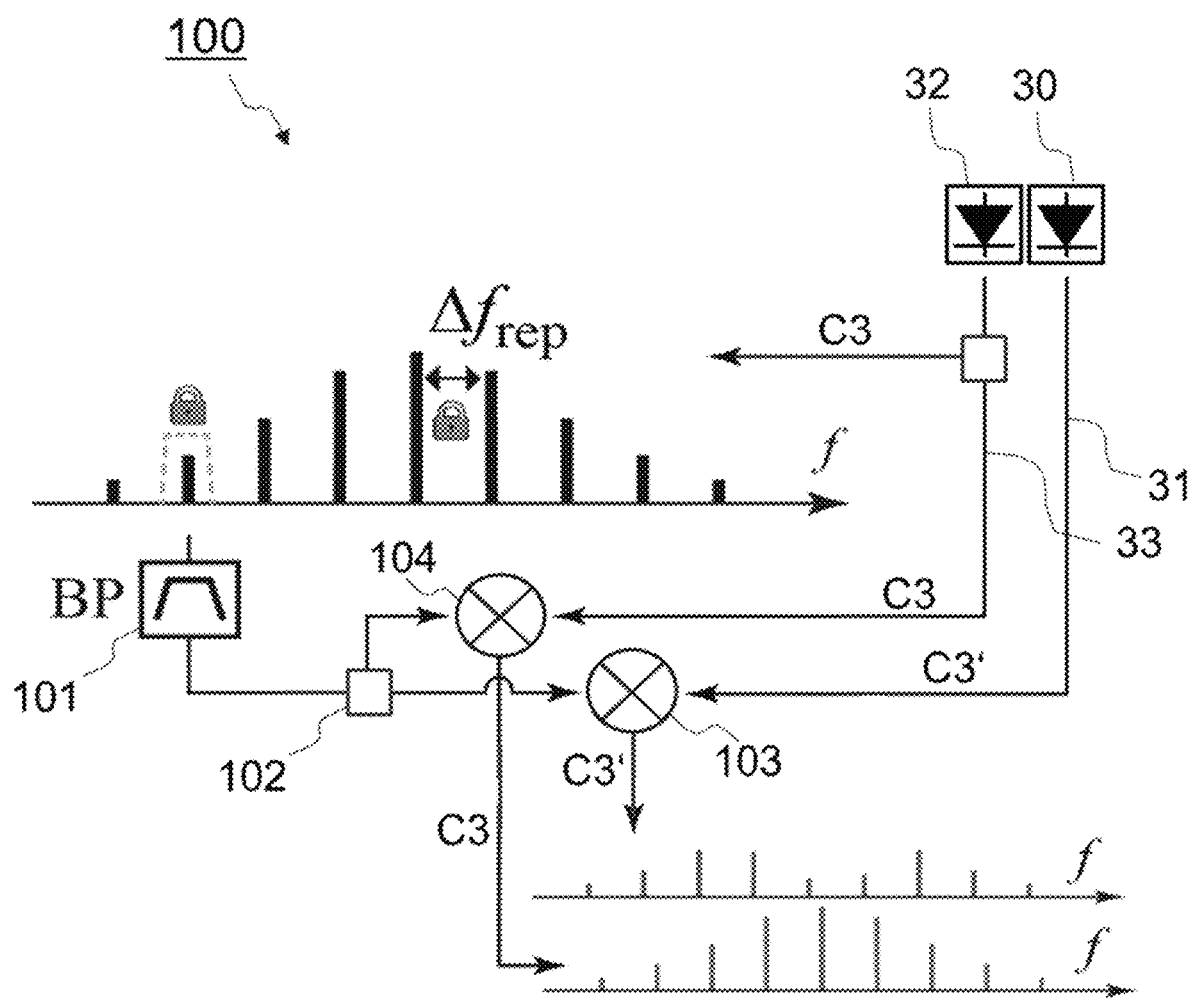
FIG. 7 shows details of an implementation of the common-mode noise compensation filter.
Figure 8:
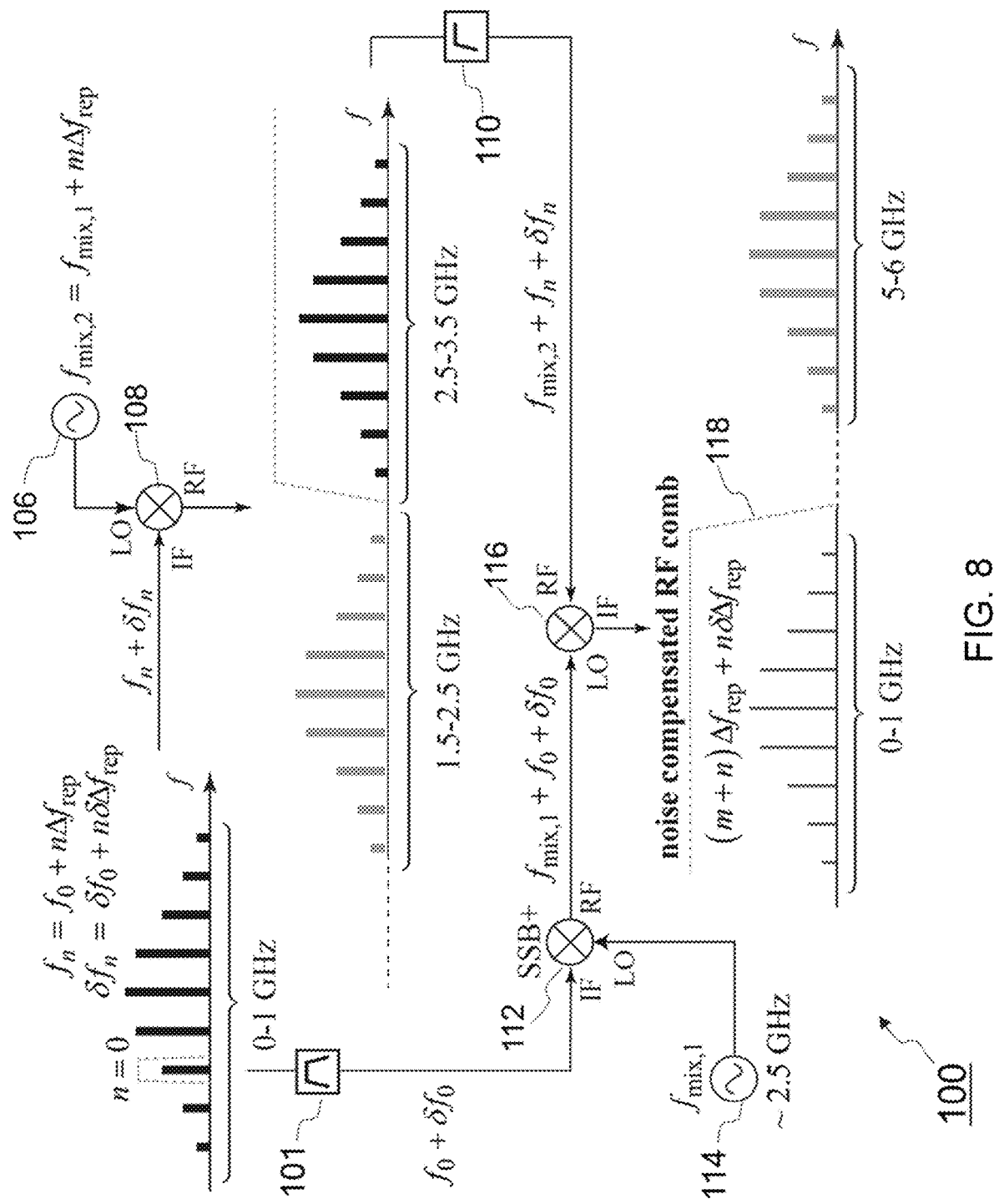
FIG. 8 shows in more detail the common-mode noise compensation filter of FIG. 7.

FIGS. 7 and 8 show details of the common-mode noise compensation filter 100 mentioned above with reference to FIG. 3 to provide a filtered version of the analog measurement signals from which the common-mode noise has been removed. Each beat note frequency component of both interferogram combs C3, C3' has a noise component that is common to all other beat note frequency components, referred to as common-mode noise. An analog noise compensation scheme is used to remove the offset frequency $\Delta f_0$ of the RF combs as well as the common-mode noise. The principle is to isolate one spectral line of one of the RF frequency combs C3 or C3' and to mix the extracted comb line with each of the RF interferogram combs C3 and C3' to produce their frequency difference.

FIG. 7 shows a noise cancelling circuit for implementing the noise cancellation scheme (NCS) for removing common-mode noise. A portion of the comb signal C3 is tapped off from the signal output line 33 from photodetector 32 (or alternatively C3' from photodetector 30, e.g., in a set-up with no reference path) and is fed through a bandpass filter 101 (which may double up as the above-mentioned bandpass filter 34 used for the master-follower feedback) to extract a single comb line of the multiheterodyne beat signal. This is then split by a splitter 102 into two portions. One portion is mixed at a SSB mixer 103 with the sample signal C3' and the other portion is mixed at a SSB mixer 104 with the reference signal C3'. The resulting RF comb is offset-free, i.e., it constitutes a harmonic comb, in which the frequency offset is zeroed and the common noise between all lines has been removed by means of the subtractive mixing of each comb with the single extracted comb line. It is noted that this set-up requires that the filtered and subtracted line is the first or last comb line in the comb spectrum.

FIG. 8 shows further details of the implementation of the NCS of FIG. 7, which can be used when a suitable single sideband mixer SSB is not available at the frequencies of the interferogram combs C3/C3'. We show components for processing a single interferogram comb, which may be comb C3 or C3'. In other words, the components shown in FIG. 8 will be duplicated, once for processing comb C3 and again for processing comb C3'. The basic principle is to frequency up-convert the entire RF comb (C3 or C3') and the extracted comb line and then to mix together the up-converted signals to obtain their difference, corresponding to the noise-compensated comb. In more detail, the frequency comb C3' in the analog signal line 31 (or C3 in 33) is upconverted in a double-balanced mixer 108 with a mixing frequency that is generated by an RF generator 106. The RF mixing frequency generator 106 is configured to generate a mixing frequency $f_{mix,\ 2}=f_{mix,\ 1}+m\Delta f_{rep}$ from the upshifting reference frequency $f_{mix,\ 1}$ of the extracted RF comb line and an $m^{th}$ harmonic of the mode spacing $\Delta f_{rep}$ of the interferogram frequency comb C3, where m is an integer number. The up-converting frequency $f_{mix,\ 2}$ needs to be high enough to ensure that the different combs generated in the mixing process do not overlap, which is achieved through a suitable choice of the integer number m. The integer m is in most cases positive, but a value of zero is possible. (For the avoidance of doubt, it is noted that the integer m is a single value, i.e. it does not represent a series.) The frequency difference between $f_{mix,\ 1}$ and $f_{mix,\ 2}$ is small. In the example set-up, it is ~200 MHz. The mixer 108 is a double-balanced mixer and outputs both the sum and difference frequency of the input signals, resulting in two RF combs, one down-shifted and the other up-shifted, these being shown in FIG. 8 with center frequencies of 2 and 3 GHz respectively. The lower frequency sideband is then filtered out with a high pass edge filter 110 to transmit only the upper frequency sideband, which is upshifted by $f_{mix,2}+m\Delta f_{rep}$. The up-conversion scheme of FIG. 8 is useful in practice, since commercially available SSB mixers typically work with a low-frequency RF signal (e.g. 10 MHz-100 MHz) and a high frequency LO signal (in the GHz range). It is noted that as well as removing the common-mode noise this design outputs an RF frequency comb which is harmonic, this being necessary in order to be able to apply coherent averaging as described further below. Separately, a portion of the comb signal C3 is tapped off from the signal output line 31 (or 33) and is fed through a bandpass filter 101 (which may double up as bandpass filter 34 used for the master-follower feedback) to extract a single comb line (indexed with n=0) of the multiheterodyne beat signal. An SSB+ mixer 112 is then used to up-convert the extracted single comb line by a fixed reference frequency $f_{mix,\ 1}$ generated by an RF generator 114. In a test example, $f_{mix,\ 1}$~2.5 GHz. The SSB mixer 112 outputs an upshifted version of the extracted comb line, so that the extracted comb line and the RF comb are upshifted by frequencies that differ by an integer number of the comb mode spacing $\Delta f_{rep}$. (Instead of the SSB mixer 112, it would be possible to use a combination of a normal standard double-balanced mixer with a suitable high pass edge filter or bandpass filter to filter out the lower frequency sideband.) The upshifted extracted comb line and the upshifted RF comb are then mixed in a mixer 116 to generate a pair of RF combs corresponding to their sum and difference frequencies. The lower frequency comb is in the same frequency range as the input frequency comb C3. A low pass filter 118 serves to filter out the upper sideband to leave a single frequency comb with the same data content as the frequency comb C3, but with common-mode noise filtered out. The signal that is output is thus a low-noise harmonic RF comb $(m+n)\Delta f_{rep}+n\delta f_{rep}$, from which the frequency noise of the selected RF comb line that was common to all comb lines has been subtracted out. The output signal is also at the baseband frequency, i.e. the frequency of the initial input comb C3, C3', since the up-conversion is followed by a down-conversion by a frequency that differs by an integer number of the comb spacing $\Delta f_{rep}$, through the combination of mixer 116 and low-pass filter 118. It will also be appreciated that bandpass filters may be used instead of the edge filters 110, 118. It is also noted that if the integer m=0, then $f_{mix,\ 1}=f_{mix,\ 2}$ and a single RF mixing frequency generator 114/106 can be used.

As already mentioned, the same NCS is duplicated for the other frequency comb C3'.

This analog noise compensation scheme greatly reduces the linewidth of all heterodyne beats. In our test system, the linewidth reduction was approximately 5 orders of magnitude.

Figure 9:
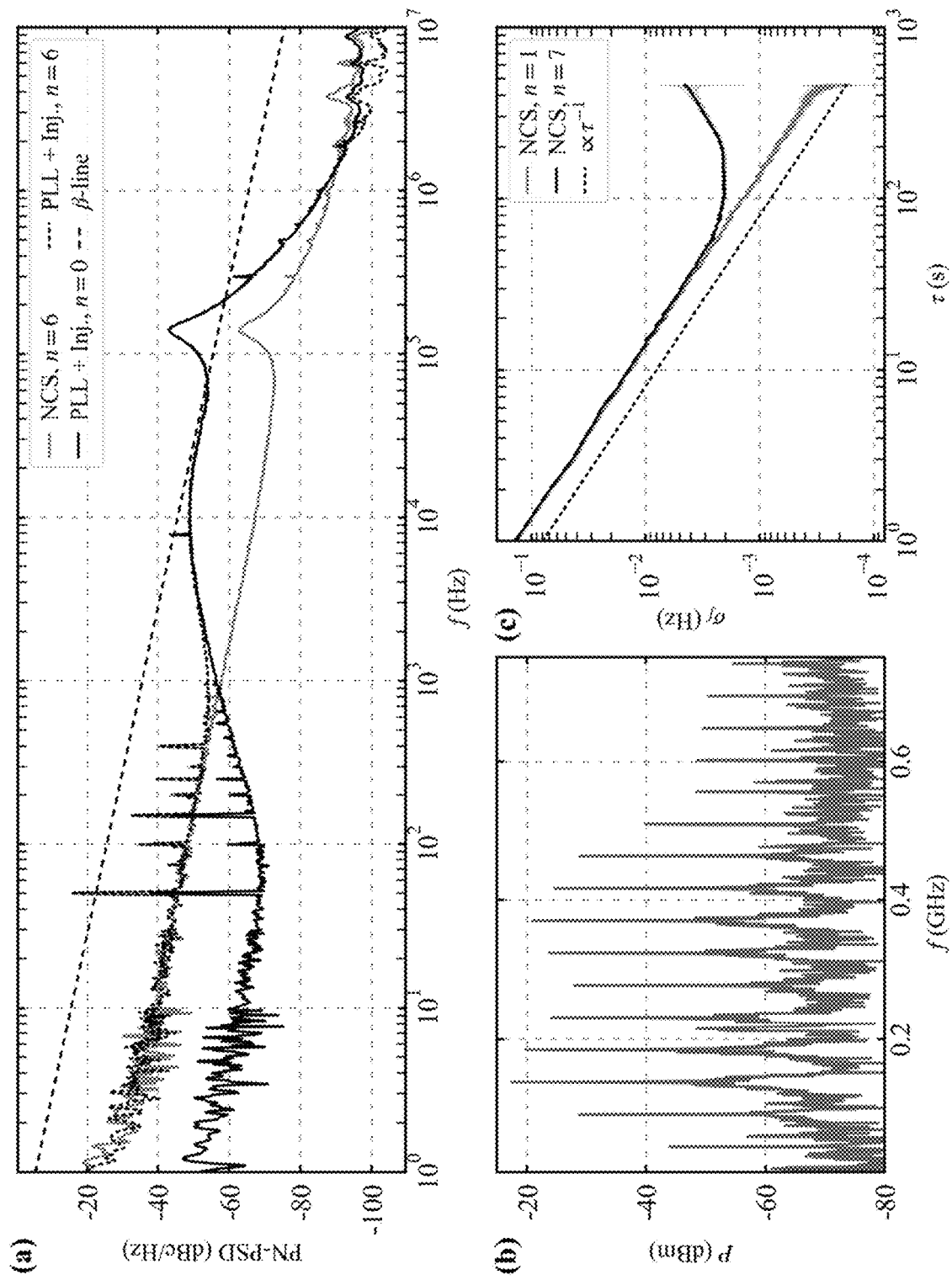
FIG. 9 shows experimental results from an example test system to compare noise characteristics with and without use of the common-mode noise compensation filter.

FIG. 9 shows experimental results of the NCS in an example DCS instrument as implemented by subtracting the common-mode frequency noise of an RF comb line located at ~200 MHz from the entire comb spectrum. Noise characteristics are compared with and without use of the NCS. In all cases, a partial or complete master-follower scheme was applied. Panel (a) is a graph plotting PN-PSD in dBc/Hz against Fourier frequency in Hz of different lines of the RF comb under various operating conditions, namely:

with PLL ("PLL")
with PLL and RF injection locking ("PLL+Inj.")
with PLL, RF injection locking and NCS ("NCS")

Panel (b) is a graph showing a representative example spectrum of a multi-heterodyne beat, the graph plotting power in dBm against frequency in GHz. Panel (c) is a graph plotting Allan deviation in Hz against integration time τ in seconds of two different lines n=1 and 7 of the RF comb ($\Delta f_{rep}$=43.85 MHz here). The displayed noise-compensated spectrum has the same overall envelope as the original one within 3 dB, but the lines are significantly narrowed (although this is not clearly visible comparing Panels (b) of FIGS. 9 and 6). The phase noise was measured for two different lines n=3 and n=6 of the noise-compensated spectrum, located at 142 MHz and 285 MHz, respectively. These lines correspond to spectral components at 342 MHz and 485 MHz, respectively, in the initial RF comb. A significant reduction of the noise of all modes is observed in the frequency range of 1 kHz to 1 MHz, where the noise being removed must be common-mode noise given the operating principle of the design. At low Fourier frequencies below ~1 kHz, the phase noise of the lines coincides with the level achieved with phase locking (PLL and RF injection) alone, i.e., the NCS is having a major positive effect in the frequency range of 1 kHz to 1 MHz as already mentioned, but is not reducing noise below 1 kHz. The source of the residual noise is not known, but likely candidates are: non-uniformities in the spacing of the comb lines; source noise from the RF generator 26; or imperfect phase locking. Using the β-separation line approximation (see reference [3]), the linewidth (at 1 second integration time) of the lines was estimated from their corresponding PN-PSD. A linewidth of 10 Hz is obtained for the line at 142 MHz (n=3) when combining the master-following stabilization and NCS, which originates mainly from 50 Hz components. The free-running linewidth of 1 MHz for the line at 200 MHz is reduced to 700 kHz with the master-follower stabilization scheme. Therefore, the addition of the NCS is observed to bring a reduction in the linewidth of the RF comb lines of almost 5 orders of magnitude. The long-term frequency stability of the harmonic RF comb obtained with the NCS was also assessed by counting the frequency of the lines n=1, 7, 8. Sub-Hz fluctuations at 1 s are observed, and the line n=1 shows sub-mHz stability at 200 s. The other lines reach 3 mHz (milliHertz) stability. The stability shown in these results is easily good enough for implementation of coherent averaging.

Figure 10:
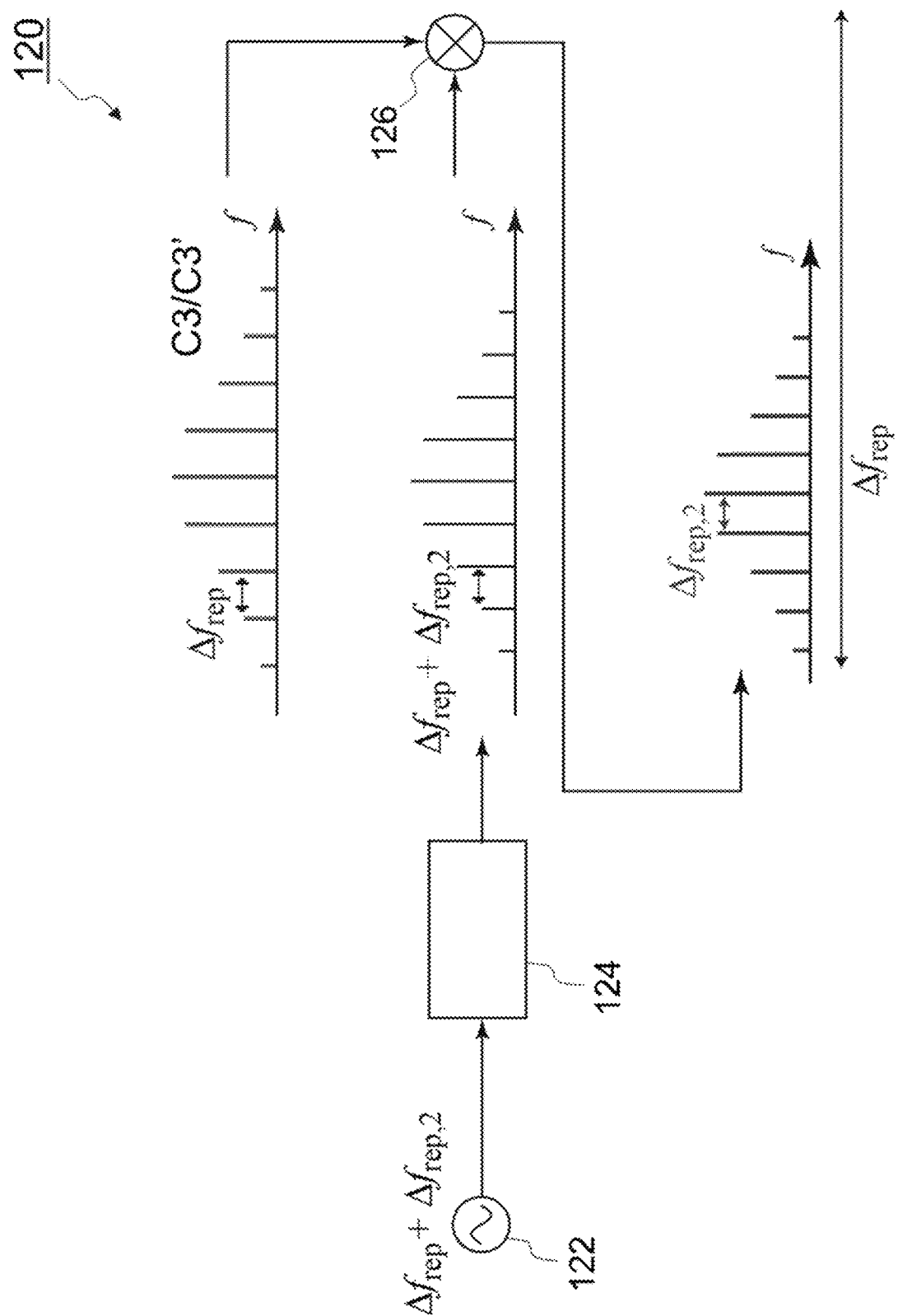
FIG. 10 shows details of an implementation of the bandwidth compression filter.

FIG. 10 shows details of the bandwidth compression circuit 120 for implementing the bandwidth reduction scheme (BRS) mentioned above with reference to FIG. 3, wherein the BRS reduces the sampling frequency that is needed and thereby permits the use of signal processing electronics with lower specification requirements. The RF comb C3 with beat note spacing $\Delta f_{rep}$ is input to the BRS, preferably after application of the NCS and also the master-follower scheme described further above. In principle, however, the BRS can operate independently of these. In the BRS, a harmonic RF reference frequency comb is generated using a comb generator 124, which produces multiple harmonics of an input RF signal. The input RF signal is a pure sinusoidal signal generated by a suitable RF generator 122. The input frequency is selected to be $f_{rep}+\Delta f_{rep,2}$ resulting in the comb generator 124 outputting a comb that is harmonic with a spacing, i.e., a frequency increment, equal to the input frequency, i.e., $\Delta f_{rep}+\Delta f_{rep,2}$, where $\Delta f_{rep,2}$ is the additional increment compared to the spacing of the comb C3. A mixer 126 is arranged to mix the interferogram frequency comb C3 with the harmonic RF reference frequency comb generated by the comb generator. This results in a down-converted version of the interferogram frequency comb that has its frequency components equally spaced by an amount $\Delta f_{rep,2}$ equal to the additional frequency increment that can be significantly smaller than the initial mode spacing $\Delta f_{rep}$ so that the down-converted version of the interferogram frequency comb is reduced in bandwidth by a factor equal to the ratio of the frequency spacing of the interferogram frequency comb and the additional frequency increment, i.e., $\Delta f_{rep}/\Delta f_{rep,2}$. If the mixer 126 is double-balanced, then a low-pass filter (not shown in FIG. 9) can be used to filter out the up-converted sideband. The difference in mode spacing between the multi-heterodyne RF comb and the reference electronic comb preferably satisfies the condition that $\Delta f_{rep,2}<<\Delta f_{rep}$, such that the resulting down-converted harmonic RF comb has a reduced mode spacing $\Delta f_{rep,2}$. The bandwidth of the comb is thereby reduced by a factor $\Delta f_{rep}/\Delta f_{rep,2}$, with the same Nyquist sampling conditions as in DCS. The amount of compression is thus selected by choosing the oscillation frequency of the RF generator 122.

By reducing the sampling bandwidth of the multi-heterodyne signal with our BRS using an auxiliary electronic comb generated by an RF comb generator, digital acquisition of the signal can be performed at a much-reduced rate and cost. For example, it may be possible to reduce the specification of the digitizer 50 by twenty times from 2 GS/sec (8 GB/s) without BRS to 0.1 GS/sec (0.4 GB/s) with BRS. The requirements for the coherent averager may also be reduced as a consequence.

The role of the coherent averager 60 of FIG. 3 is now described in more detail. Although coherent averaging is a numerical data processing method that is well described in the literature (see references [4] and [5]), specific aspects relevant for digitization and digital signal processing are explained in the following, such as the concepts of temporal CA and spectral CA. In general, CA is a processing method that enables isolation of the periodic components of a signal. CA can be used to increase the signal-to-noise ratio (SNR) of a periodic signal and thereby to significantly reduce the amount of data that needs to be processed and stored. CA can be applied to DCS data provided that the RF comb spectrum is harmonic, since a harmonic frequency comb is required in order to make the corresponding temporal signal periodic. A sufficiently harmonic frequency comb can be provided by undertaking the above-described measures for improving DCS signal quality through phase locking and NCS. Importantly, these signal quality improvements can enable the real-time application of CA during data acquisition, which is highly significant, since real-time application of CA can drastically decrease the amount of data that needs to be handled. (By contrast if CA is applied in post-processing, then it is necessary to pre-process and store all the measurement data that is acquired, so the data acquisition electronics needs to have much greater processing power and storage capacity.) The ability to apply CA in real time is a significant advantage, since the quantity of data collected by DCS is massive. It is noted that CA improves the SNR of the heterodyne signal linearly with the measurement time.

The principle of DCS is to down-sample the optical comb to the RF domain by heterodyning it with another comb with a slightly different mode spacing, resulting in a RF comb in the photodiode output signal. An RF comb, which is characterized by a mode spacing (or repetition rate) $\Delta f_{rep}$ and an offset frequency $\Delta f_0$, produces a temporal signal with a periodic envelop of time constant $1/\Delta f_{rep}$ and a voltage that evolves with respect to the periodic envelope with frequency $\Delta f_0$. When the offset frequency is zero, the signal (and not only the envelope) is periodic. In the spectral domain, it corresponds to a harmonic frequency comb, as only integer multiples of the repetition rate are present in the comb spectrum. The signal can also be periodic, if the repetition rate is a multiple of the offset frequency, i.e., $\Delta f_{rep}=n_r\Delta f_0$, in which case the period of the signal is multiplied by $n_r$. Let $v(t)$ be a perfectly periodic signal such that $v(t+\Delta T)=v(t)$, and $v_i=v(t_i)+\sigma_i$ be the digitized signal comprising white noise $\sigma_i$ from diverse sources. Here $t_i$ are the sampling times for $i=0, 1, \ldots, N_s-1$. The digitized signal is then periodic (apart from the noise) with a period $\Delta T_d = n_d \Delta T$ only if the sampling time $\Delta T_s$ is chosen so that an integer number of samples $N_b$ corresponds to an integer multiple $n_d$ of the period $\Delta T$, i.e. $N_b \Delta t_s = n_d \Delta T$. Under this condition, the time signal $v_i$ is split into $n_s=N_s/N_I$ slices containing $n_c$ periods $\Delta T_d$ corresponding to $N_I=N_b n_c$, samples, and all slices are averaged. This results in a signal $v_{CA}(t_j)$, $j=0, 1, \ldots, N_I-1$, which contains $n_c n_d$ periods $\Delta T$ of the original signal $v(t)$. Mathematically, the operation is $$v_{CA}(t_j) = \frac{1}{n_s}\sum_{n=0}^{n_s-1} v_{nN_I+j} = v(t_j) + \frac{1}{n_s}\sum_{n=0}^{n_s-1} \sigma_{nN_I+j} = v(t_j) + \sigma'_j,$$

such that the interferogram of sample number $N_s$ is reduced in size by a factor $n_s$. All the data is then contained in $N_I$ samples covering only a few periods. Moreover, the noise in the quantity $v_{CA}$ is washed out in the averaging process as a result of the central limit theorem for the considered white noise, $$\langle \sigma'^2_j \rangle = \frac{1}{n_s}\langle \sigma_i^2 \rangle.$$

Figure 11:
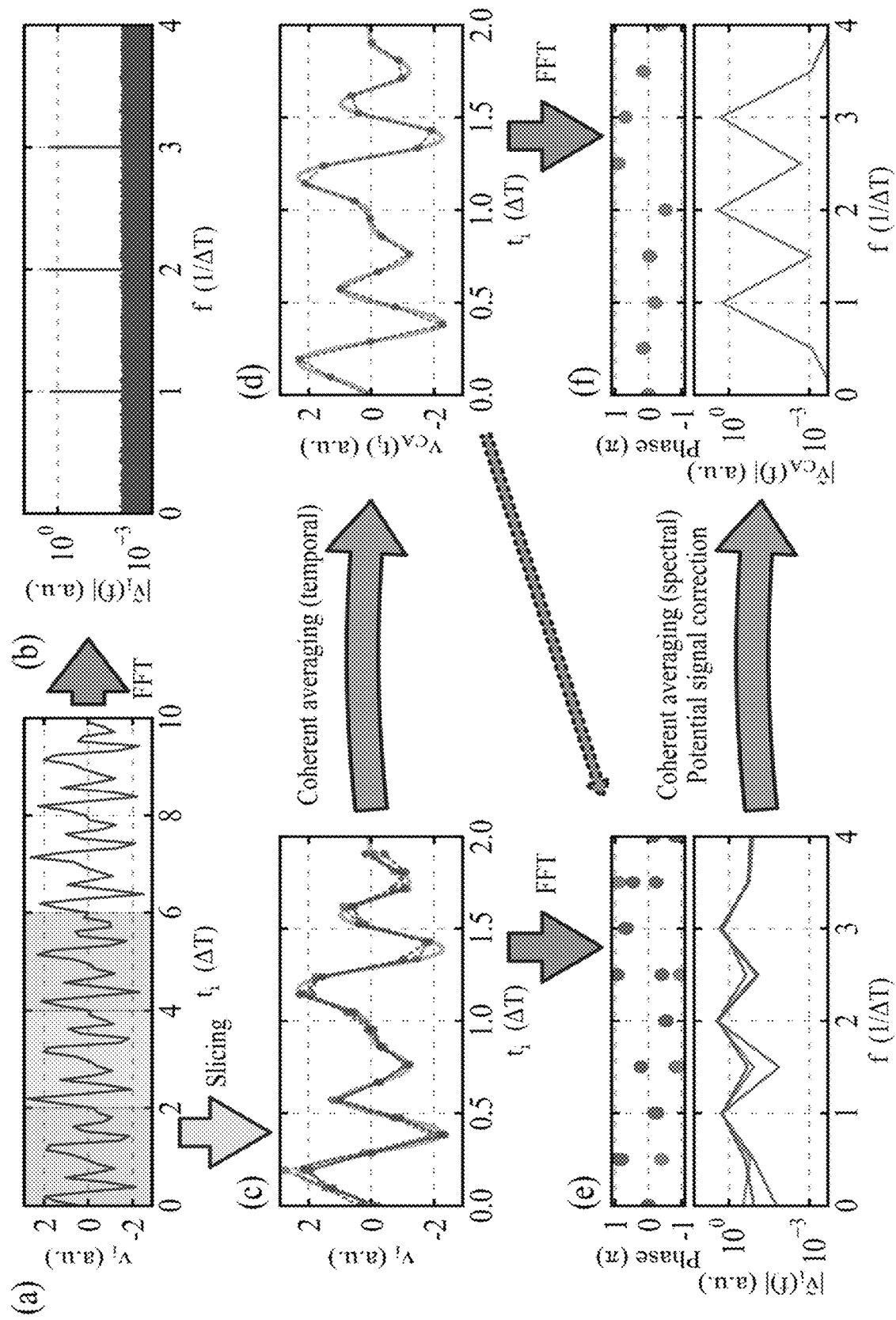
FIG. 11 provides a schematic summary of coherent averaging.

FIG. 11 (a), (c-d), (e) schematizes the principle for $n_d=2$, $n_c=1$, $N_b=21$, $n_s=2^{15}$. CA is thus a simple algorithm, which can be implemented directly in the data acquisition unit (in real time), such that the amount of data to transfer is greatly reduced. This significantly reduces the total measurement time, which comprises loading time from the data acquisition unit to the final storage. Moreover, the processing of the amplitude and phase of the spectral components is straightforward, as the signal is located exactly every $n_c n_d$ bin of the fast Fourier transform (FFT) due to the sampling condition. This additionally guarantees that no spectral leakage is induced.

If the frequency fluctuations of the signal are too large to implement temporal CA as described above, spectral CA may be implemented instead. This is done by averaging the individual FFTs of the slices (see FIG. 11(e) as discussed below). Indeed, it offers the advantage that the signal, located at known frequency bins, may be easily analyzed and corrected before being averaged spectrally. For example, in DCS with two photodetectors, the reference signal can be used to monitor phase and amplitude fluctuations such as to correct them in the sample signal. Again, the noise components outside the signal bins average out as a result of their random phases.

Spectral CA cannot be straightforwardly implemented in real time with current commercially available numerical processing capabilities, but real-time combined spectral and temporal CA is possible. Temporal coherent averaging is implemented over time scales shorter than the coherence time of the signal to reduce the amount of data to be handled. Over longer time scales, the FFTs of the temporal coherent averages are corrected with a reference signal before being averaged spectrally, thus improving the SNR over much longer times.

FIG. 11 provides a schematic summary of coherent averaging where panels (a) to (f) show the following: (a) A noisy time signal with period $\Delta T$ may be sliced into segments of duration $n_c n_d \Delta T$, comprising $N_I$ samples. Three different slices at t: 0-2; 2-4; and 4-6 are shown. (b) FFT of the full digitized signal. (c) Three slices are superimposed showing some fluctuations on top of the continuous periodic signal (solid gray line). (d) The time slices may be averaged coherently to isolate the periodic signal by washing out random noise. (e) The spectrum of each time slice can be computed in parallel. The signal of interest is located exactly every $n_c n_d$ bins of the FFT, thus preventing spectral leakage and facilitating analysis and correction of known deviations. (f) A signal with a high SNR may be obtained from the FFT of the temporal coherent average, or from the average of individual spectra. Alternatively, temporal averaging may be implemented on short time scales while spectral averaging with signal correction is implemented on larger time scales, as shown by the diagonal arrow connecting Panels (d) and (e). Panels (a), (c-d) and (e) schematize the principle for $n_d=2$, $n_c=1$, $N_b=21$, $n_s=2^{15}$. Advantages of CA for DCS include that all data from a long measurement can be fitted into $N_I$ samples covering only a few periods. CA also simplifies the processing of the amplitude and phase of the spectral components, as the signal is located exactly every $n_c n_d$ bin of the FFT due to the sampling condition, which also guarantees that no spectral leakage is induced. CA may be done as post processing, or in real time, i.e., in-line, by the acquisition unit to reduce its memory requirement. The linear SNR improvement is limited in time by the frequency stability of the periodic signal and the phase lock between the sampling frequency and the repetition rate of the signal.

Due to the linearity of the FFT, the same result can be obtained by averaging the individual FFTs of the slices, as shown in Panel (e). This is denoted as spectral coherent averaging in contrast to the temporal coherent averaging. Again, the noise components outside the signal bins average out as a result of their random phases. Although this process cannot be straightforwardly implemented in real time, it offers the advantage that the signal bins may be analyzed and/or corrected in a simple way before being spectrally averaged. Indeed, the signal always lies in the same bins. For example, in DCS with two photodetectors, the reference signal can be used to monitor phase and amplitude modulations such as to correct them in the sample signal.

Alternatively, a combination of both spectral and temporal coherent averaging may be implemented. Temporal coherent averaging is implemented over time scales smaller than the coherence time of the signal. This greatly reduces the amount of data to process. Over longer time scales, the FFTs of the temporal coherent averages are corrected with a reference signal before being averaged spectrally, thus improving the SNR over much longer times.

Figure 12:
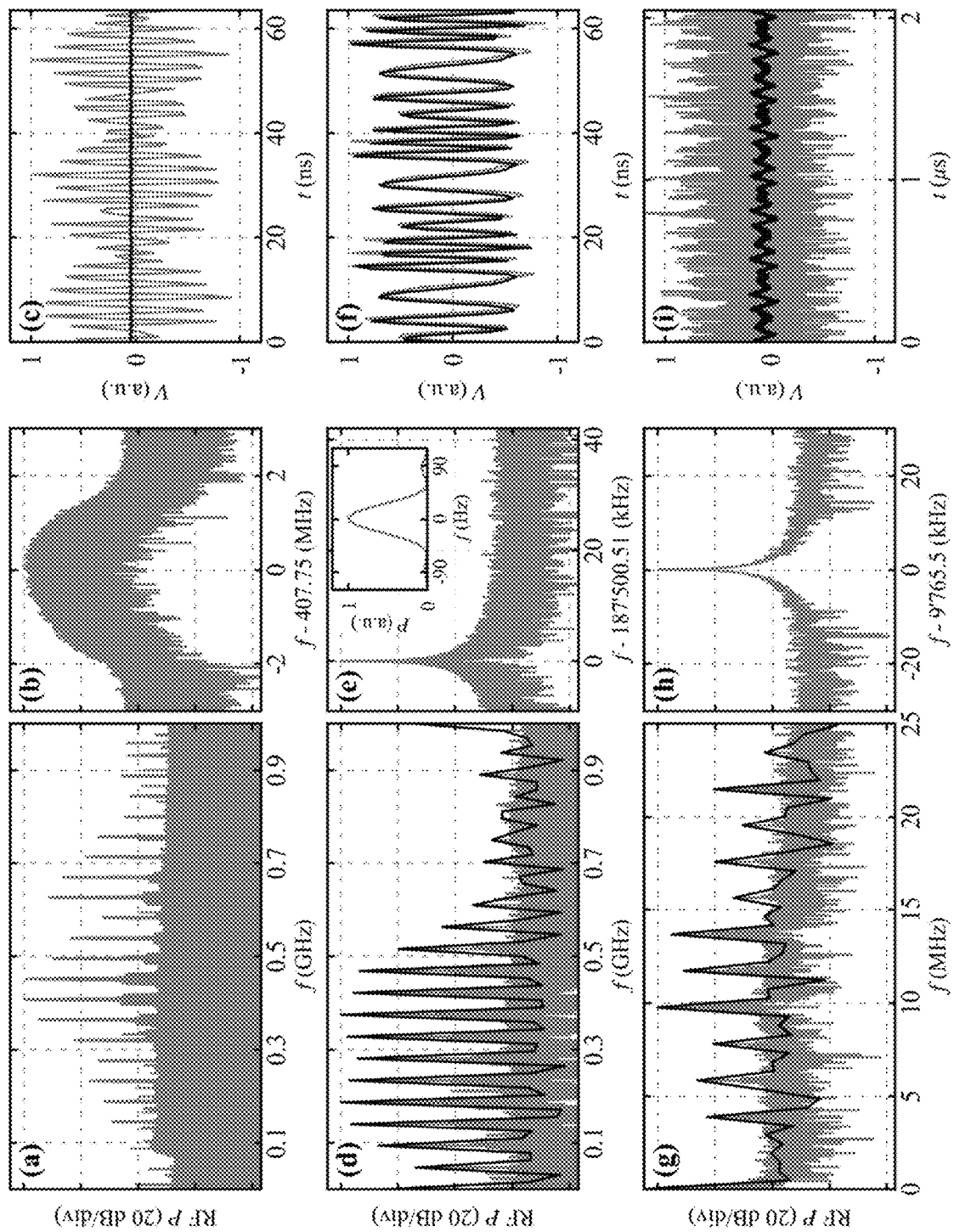
FIG. 12 in the upper, middle and lower rows of panels compares three different sets of results from an example test system configured to apply: none of the proposed improvements (upper); master-follower phase locking and common-mode noise filtering, but not bandwidth compression (middle); and all three of the proposed improvements (lower).

FIG. 12 shows the dual comb multi-heterodyne beat signal obtained in an example test system in different configurations with and without coherent averaging. Namely, three sets of measurements are shown:
- upper row of panels—no stabilization (corresponding to prior art);
- middle row of panels—with phase locking (PLL and RF injection) and NCS;
- bottom panel—with phase locking, NCS and BRS.

Time traces of the sample and reference signals were acquired at 2 GSample/s and 16 bits resolution using the acquisition unit of the Iris-F1 spectrometer from IRsweep AG. The measurements are limited to 16 ms, corresponding to $2^{25}$ samples per acquisition and channel. The data acquisition unit was not referenced to the reference clock, so that the sampling frequency was not exactly 2 GHz.

In Panels (a), (b), (d), (e), (g) and (h), the x-axes show frequency in GHz or MHz and the y-axes show RF power in units of 20 dB/division. The inset of Panel (e) shows power in arbitrary units against frequency in Hz. In Panels (b), (e) and (h), the frequency axis is offset by the stated amount corresponding to the frequency of the illustrated peak, so that the peak is at zero. In Panels (c), (f) and (i) the plots are of voltage in arbitrary units against time in ns or µs. The individual panels show: (a) Spectrum from the FFT of a 16 ms time trace. (b) Zoom of a line of Panel (a). (c) Example time trace including approximatively 3 periods (gray). The signal averages out when coherent averaging is performed (bold black). (d) Spectrum from a 0.1 ms time trace (gray) compared to that obtained by coherent averaging (bold black). (e) Zoom of a comb line from a 16 ms time trace. The inset shows the linewidth of the comb line in linear scale, limited by the measurement time. The signal was zero-padded. (f) Example time signal (gray) compared to the coherent average of 2048 traces (0.1 ms). The phase slip led to losses of the high frequency components. (g) As (d). (h) Zoom on a comb line from (g). (i) Time trace (gray) and coherent averaging (bold black). Only the slow frequency components remain.

The typical linewidth of the comb lines is in the MHz range. The highest SNR (in terms of power spectrum) is approximately 50 dB. Panel (c) shows a fraction of the time trace containing three periods with different phase offsets (gray). The coherently averaged signal is also shown (bold black) with 2048 ($n_s$) slices of $N_f$=128 samples. However, the conditions for CA are not fulfilled and the CA signal vanishes.

Panel (d) shows the FFT of a 130 µs time trace of the noise compensated DCS signal (gray), and, the spectrum obtained by CA of the same time trace with slices of 128 samples (bold black). As the RF comb is harmonic and $\Delta f_{rep}$ is exactly $3f_s/N_f$ (46.875 MHz), every third bin of the spectrum lies on a comb line ($n_d$=3, $n_c$=1). It can be noted that the SNR is much higher than in Panel (a) even in a 10 times shorter measurement times as a result of the spectral stability of the signal. Moreover, CA leads to a higher SNR than from the FFT of the entire trace, with a maximum SNR of almost 70 dB.

Panel (e) shows a closer view on the fourth line of the comb. Here the 16 ms signal was zero-padded to show the linewidth below 100 Hz (inset), as limited by the measurement time. The center frequency, which is 187,500,510 Hz, is 510 Hz above the expected value of $4\Delta f_{rep}$ because of the mismatch between the internal clock of the acquisition unit and the reference clock used in the stabilization scheme. Panel (f) compares a single slice containing exactly three periods ($3\Delta T=\Delta T_d$) and the coherent average from 2048 slices. One notices almost perfect correspondence, due to the high frequency stability of the signal. The difference is induced by the small phase slip occurring between $f_s$ and $\Delta f_{rep}$, which can be seen as a small delay of the average with respect to the single slice, or as a filter on the higher frequency components (fast changes), which are more sensitive to this mismatch.

Panel (g) presents the down-converted spectrum using the BRS with $\Delta f_{rep,2}=f_s/2^{10}=1,953,125$ Hz, which fits within a 25 MHz bandwidth. CA is implemented with $n_c$=4, $n_d$=1, such that 64 slices of 4096 samples are averaged. Although the linewidth of the RF comb lines has not deteriorated (Panel (h)), the SNR is reduced to less than 40 dB. We assume that more careful adjustment of the power at the mixer and the use of a low pass filter at 25 MHz would improve the SNR. Indeed, Panel (i) shows that CA is effective, but the signal is composed of many spurious high frequency components, which result from various mixing products.

A proof of principle spectroscopic measurement of polypropylene (PP) was made in an example DCS instrument to demonstrate the suitability of the implemented schemes. A PP sheet with a thickness of 500±5 µm was placed in the path of the combined beams. Two fast photodiodes were used to provide sample and reference measurements. The two photodiodes have different sensitivities, such that a background measurement was recorded in the absence of a sample to calibrate the respective photodiode signals.

The transmission of a given QCL comb line was calculated as follows $$T = \left|\frac{A_s B_r}{A_r B_s}\right|.$$

where $A_i$, $B_i$ are the amplitudes of the line from the sample and background measurements respectively. The subscripts denote the signal from the sample photodiode (s) or from the reference photodiode (r).

Figure 13:
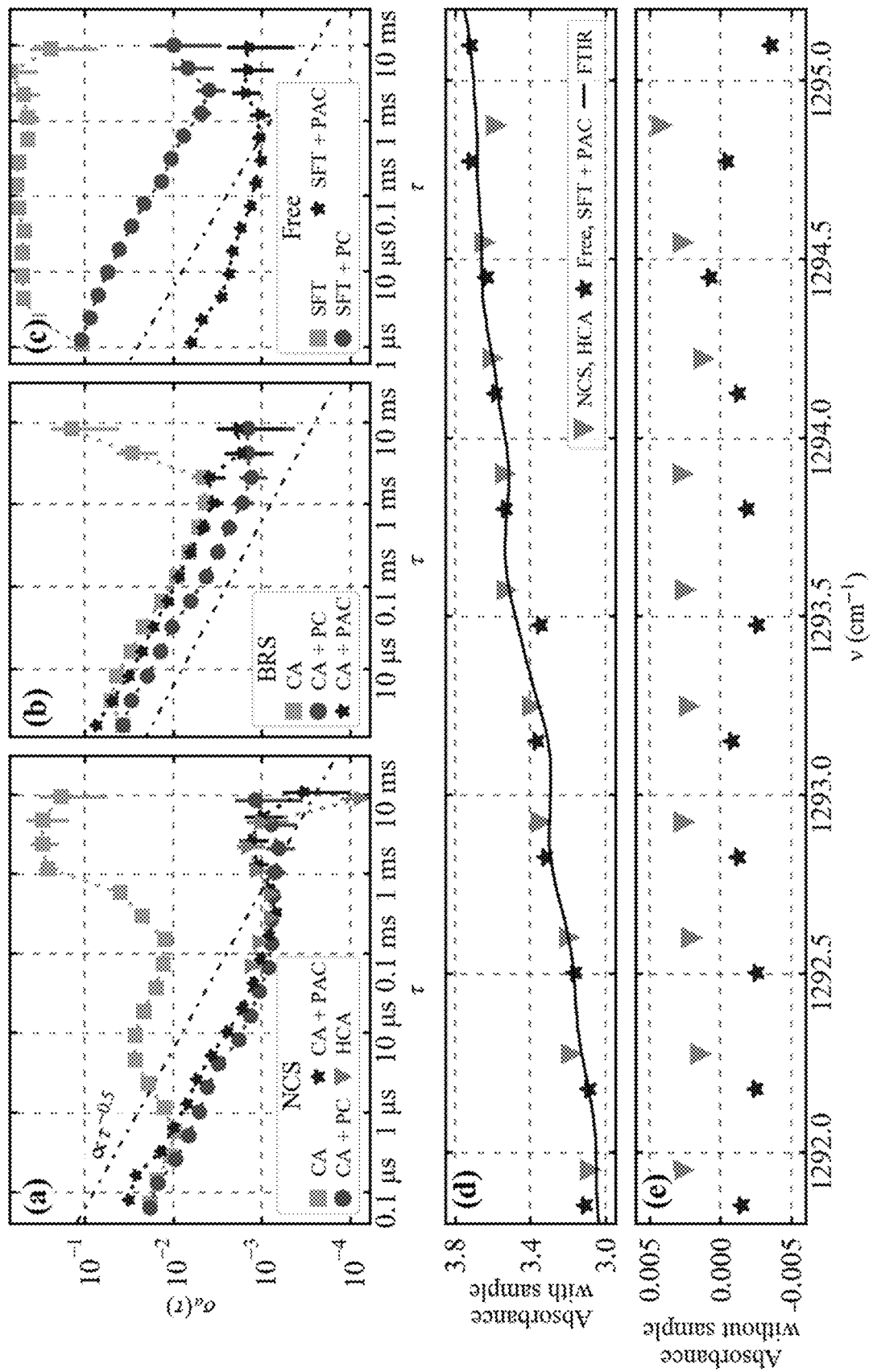
FIG. 13 shows further comparative results for several different measurements and coherent processing methods to compare Allan deviation and absorption spectra of the same sample.

FIG. 13 shows experimental data for fractional amplitude Allan deviation $\sigma_a(\tau)$ as a function of integration time $\tau$ as well as spectroscopic results for several different combinations of data acquisition and processing methods. Panels (a-c) show fractional amplitude Allan deviations of chosen lines. Data points are offset horizontally for clarity. Amplitude noise characterization is performed as follows. The fractional amplitude Allan deviation $\sigma_a(\tau)$ as a function of integration time $\tau$ is computed by slicing the time traces into slices of time $\tau$. For the NCS and BRS, temporal CA is applied on each slice, and the amplitude of a line is given at specified bins of the Fourier transform of the CA. In the free running cases, the amplitudes are found by a standard peak finder algorithm on the Fourier transform of each slice (labeled by SFT). The Allan deviation of a line's amplitude is then computed from the time series of the amplitude of the line. Additionally, spectral CA can be implemented instead of temporal CA to apply phase correction (PC) or phase and amplitude correction (PAC), by dividing the signal bins of the sample photodiode by the phase factor, or by the amplitude of the respective bin of the reference photodiode at each time slice. This correction can also be applied on the peak amplitude in the free running case. To the NCS measurement data, we apply a hybrid form of CA, referred to in the following as HCA, in which the CA is performed in part temporally and in part spectrally. In this example implementation of HCA, the temporal CA part is performed with 1024 slices (coherence time=66 µs), followed by spectral CA with PAC. With the example of a 66 µs temporal CA applied in real time, there is a reduction of three orders of magnitude in the amount of downstream data to transfer and store. NCS with CA shows an improvement of the fractional amplitude noise with $\tau^{-0.5}$ (dot dashed line). However, the phase slip resulting from the clock mismatch introduces a decrease in performance at integration times longer than 1 ms. Moreover, ground loops with frequencies of ~100 kHz add amplitude noise in Panel (a) at approximately 1 µs. When PC or PAC are applied, the Allan deviation decreases as $\tau^{-1/2}$ up to the ms range. These corrections effectively attenuate the effects of the phase slip and the ground loops. The corrections are also effective for HCA, where the correction is done at longer time scales than the noise source. In the free running case, corrections enable the same performance as with the other schemes. The limit in the ms range is believed to come from the uncorrelated amplitude fluctuations from the two photodiodes originating from their vibrations.

Panel (a) shows results for data acquired with phase locking and NCS followed by processing with CA, with CA and phase correction (PC), with CA and phase and amplitude correction (PAC), and with HCA. Panel (b) shows results for data acquired with phase locking and BRS followed by processing with CA, with CA and PC, and with CA and PAC. Panel (c) shows results for data acquired in the free running case without any stabilization where the amplitudes are determined by SFT or by SFT optionally followed by processing with PC or with PAC. Panel (d) shows a DCS measurement of PP, compared with results from a standard FTIR (Fourier transform infrared) measurement. The measurement is for acquisitions of 16 ms. The frequency axis is offset to match the absorption spectrum measured by DCS with an FTIR reference measurement of the same sample (solid line), as no absolute optical frequency reference was available during the experiments to calibrate the horizontal axis of the spectrum. The NCS with HCA (inverted triangles) provide similar results as in the free-running condition with PAC (five-pointed stars). The measurement results are consistent with those from FTIR within an error of the order of 0.05 in absorbance. Panel (e) shows results from a reference measurement with no sample showing an accuracy of better than 0.005 when the background measurement immediately follows the sample measurement.

In summary, we have described a dual-QCL comb DCS instrument incorporating two different phase locking schemes with PLL and RF injection locking. The offset frequency difference was corrected by acting on the driving current of the follower QCL, while the repetition frequency difference was locked by electrical extraction, upshifting, and injection. The frequency noise of the RF comb was further reduced using an all RF noise compensation scheme, which strongly reduced the common phase noise at Fourier frequencies between 1 kHz and 1 MHz. These steps enabled fast and efficient sampling of the comb through coherent averaging using a minimum number of optical components for DCS. This allowed for reduced data handling and computational time for DCS in a proof-of-principle experiment. Lastly, we lowered the digital sampling requirements by reducing the acquisition bandwidth by a factor of 40. The three principal measures presented in this document can be applied individually or in a combined way. We expect that they will benefit QCL-based DCS by enabling more accurate measurements, owing to the increased possible averaging time. Moreover, by integrating all RF components in a single printed-circuit board (PCB), the NCS, BRS and the master-follower stabilization (i.e. phase locking) can be integrated in existing commercial systems, thereby offering higher quality dual comb spectrometers.

It will be clear to one skilled in the art that many improvements and modifications can be made to the foregoing exemplary embodiment without departing from the scope of the present disclosure.

REFERENCE NUMERALS

S sample (cell)
C1 first (optical) frequency comb (local oscillator)—prime indicates post sample passage
C2 second (optical) frequency comb (interrogator)—prime indicates post sample passage
C3 third (electrical, interferogram) frequency comb—prime indicates mixed from at least one optical comb that has passed through sample
4 dielectric resonator oscillator (DRO)
5 dual-comb spectrometer
6 mixer
7 mixer
8 PLL loop filter (low pass)
9 PID controller
10 first laser source (local oscillator/master)
12 second laser source (interrogator/follower)
14 master-follower phase locking features (general)
16 DC current driver for first laser source 10
17 DC current driver for second laser source 12
18 phase locking circuit
20 beam splitters
22 mirrors
23 bias tee
24 tap line for master oscillation frequency
25 single sideband (SSB) mixer
26 RF reference source (Δfrep)
27 amplifier
28, 29 bias tee
30 sample photodetector
31 sample photodector output signal (line)
32 normalizing photodetector
33 normalizing photodector output signal (line)
34 bandpass filter
35 phase comparator
36 reference generator
37 PID controller
38 PLL for second laser RF feedback control (phase locking in second degree of freedom)
40 analog signal (pre-)processing unit
45 amplifier(s) and edge/bandpass filter(s)
50 digitizer or data acquisition (DAQ) unit with analogue-to-digital converters (ADCs)
60 coherent averager
70 digital signal processor (DSP)
80 memory
90 control unit for spectrometer
100 common-mode noise compensation filter
101 bandpass filter
102 splitter
103 SSB mixer
104 SSB mixer
106 RF mixing frequency generator
108 non-SSB mixer
110 high pass edge filter
112 SSB+ mixer
114 RF mixing frequency generator
116 non-SSB mixer
118 low pass edge filter 120 bandwidth compression circuit
122 sinusoidal RF generator
124 RF comb generator
126 mixer

REFERENCES

[1] F. Cappelli, L. Consolino, G. Campo, I. Galli, D. Mazzotti, A. Campa, M. Siciliani de Cumis, P. Cancio Pastor, R. Eramo, M. Rösch, M. Beck, G. Scalari, J. Faist, P. De Natale, and S. Bartalini, "Retrieval of phase relation and emission profile of quantum cascade laser frequency combs," Nat. Photonics 13(8), 562-568 (2019)
[2] WO2020030772A1—Technical University of Vienna—B. Schwarz, J. Hillbrand, and G. Strasser
[3] G. Di Domenico, S. Schilt, and P. Thomann, "Simple approach to the relation between laser frequency noise and laser line shape," Applied optics 49(25), 4801-4807 (2010)
[4] O. Rompelman and H. H. Ros, "Coherent averaging technique: A tutorial review Part 1: Noise reduction and the equivalent filter," Journal of Biomedical Engineering 8(1), 24-29 (1986)
[5] O. Rompelman and H. H. Ros, "Coherent averaging technique: A tutorial review Part 2: Trigger jitter, overlapping responses and non-periodic stimulation," Journal of Biomedical Engineering 8(1), 30-35 (1986)

What is claimed is:

1. A dual-comb spectrometer comprising:
a first laser source operable to output a first light signal containing a first frequency comb (C1) consisting of a finite series of discrete frequencies separated by a first intermode beat frequency ($f_{rep,1}$);
a first electrical driver connected to the first semiconductor laser source to apply a first drive current signal to cause generation of the first light signal;
a second laser source operable to output a second light signal containing a second frequency comb (C2) consisting of a finite series of discrete frequencies separated by a second intermode beat frequency ($f_{rep,2}$) having a frequency offset ($\Delta f_{rep}$) from the first intermode beat frequency;
a second electrical driver connected to the second semiconductor laser source to apply a second drive current signal to cause generation of the second light signal;
a sample detector operable to output an electrical measurement signal and arranged to receive a combined light signal from superimposing the first and second light signals after at least the second light signal has traversed a sample space, wherein the measurement signal contains an interferogram frequency comb formed by heterodyne mixing of the first and second light signals and so comprises a plurality of beat note frequency components equally spaced in frequency by an amount equal to the difference between the first and second intermode beat frequencies; and
a noise cancelling circuit, the noise cancelling circuit comprising:
a beat-note extracting bandpass filter configured to extract a beat note component from the interferogram frequency comb (C3');
a first mixing frequency generator configured to generate a first mixing signal having a first mixing frequency ($f_{mix,1}$);
a first upshifting mixer arranged to upshift the extracted single beat note component output from the beat-note extracting bandpass filter to a higher frequency ($f_{mix,1}+f_0+\delta f_0$) by mixing it with the first mixing signal;
a second mixing frequency generator configured to generate a second mixing signal having a frequency ($f_{mix,2}=f_{mix,1}+m\Delta f_{rep}$) that is offset from the first mixing frequency ($f_{mix,1}$) by an integer multiple (m) of the repetition frequency of the interferogram comb ($\Delta f_{rep}$);
a second upshifting mixer arranged to upshift the plurality of beat note frequency components in the measurement signal to higher frequencies ($f_{mix,2}+f_n+\delta f_n$) by mixing them with the second mixing signal; and
a noise-cancelling mixer arranged to receive and mix the extracted upshifted single beat note component and the plurality of upshifted beat note frequency components of the interferogram frequency comb, thereby to generate a noise-reduced version of the measurement signal from which common-mode noise has been subtracted, common-mode noise being a noise component that each beat note frequency component has in common with all other beat note frequency components.

2. The spectrometer of claim 1, further comprising:
a bandpass or high-pass filter arranged between the second upshifting mixer and the noise-cancelling mixer and configured to pass a single frequency comb of the plurality of upshifted beat note frequency components to the noise-cancelling mixer.

3. The spectrometer of claim 1, further comprising:
a bandpass or low-pass filter arranged to filter the output of the noise-cancelling mixer to remove an upshifted sideband duplicate of the measurement signal and pass the down-shifted noise-reduced version of the measurement signal.

4. The spectrometer of claim 1, further comprising:
an analog-to-digital converter arranged to receive and digitize the filtered version of the measurement signal.

5. The spectrometer of claim 4, further comprising:
a coherent averager configured to apply coherent averaging to the digitized version of the measurement signal received from the analog-to-digital converter.

6. A method of removing common-mode noise from a measurement signal obtained by a dual-comb spectrometer comprising:
a first laser source operable to output a first light signal containing a first frequency comb (C1) consisting of a finite series of discrete frequencies separated by a first intermode beat frequency ($f_{rep,1}$),
a second laser source operable to output a second light signal containing a second frequency comb (C2) consisting of a finite series of discrete frequencies separated by a second intermode beat frequency ($f_{rep,2}$) having a frequency offset ($\Delta f_{rep}$) from the first intermode beat frequency; and
a sample detector operable to output an electrical measurement signal and arranged to receive a combined light signal from superimposing the first and second light signals after at least the second light signal has traversed a sample space, wherein the measurement signal contains an interferogram frequency comb (C3') formed by heterodyne mixing of the first and second frequency combs (C1', C2') contained in the first and second light signals and so comprises a plurality of beat note frequency components equally spaced in frequency by an amount ($\Delta f_{rep}$) equal to the difference between the first and second intermode beat frequencies, the method comprising:

extracting a beat note component from the interferogram frequency comb (C3') by passing the measurement signal through a beat-note extracting bandpass filter;

generating a first mixing signal having a first mixing frequency ($f_{mix,1}$) with a first mixing frequency generator;

upshifting the extracted single beat note component output from the beat-note extracting bandpass filter to a higher frequency ($f_{mix,1}+f_0+\delta f_0$) by mixing it with the first mixing signal using a first upshifting mixer;

generating a second mixing signal with a second mixing frequency generator having a frequency ($f_{mix,2}=f_{mix,1}+m\Delta f_{rep}$) that is offset from the first mixing frequency ($f_{mix,1}$) by an integer multiple (m) of the repetition frequency of the interferogram comb ($\Delta f_{rep}$);

upshifting the plurality of beat note frequency components in the measurement signal to higher frequencies ($f_{mix,2}+f_n+\delta f_n$) by mixing them with the second mixing signal using a second upshifting mixer; and receiving and mixing the extracted upshifted single beat note component and the plurality of upshifted beat note frequency components of the interferogram frequency comb with a noise-cancelling mixer, thereby to generate a noise-reduced version of the measurement signal from which common-mode noise has been subtracted, common-mode noise being a noise component that each beat note frequency component has in common with all other beat note frequency components.

7. The method of claim 6, further comprising:
using a bandpass or high-pass filter arranged between the second upshifting mixer and the noise-cancelling mixer to pass a single frequency comb of the plurality of upshifted beat note frequency components to the noise-cancelling mixer.

8. The method of claim 6, further comprising:
using a bandpass or low-pass filter to filter the output of the noise-cancelling mixer to remove an upshifted sideband duplicate of the measurement signal and pass the down-shifted noise-reduced version of the measurement signal.

9. The method of claim 6, further comprising:
using an analog-to-digital converter to receive and digitize the filtered version of the measurement signal.

10. The method of claim 9, further comprising:
coherently averaging the digitized version of the measurement signal received from the analog-to-digital converter.

11. The method of claim 10, wherein the coherent averaging is applied in real-time during data acquisition by the dual-comb spectrometer.

* * * * *